United States Patent
Yamanaka et al.

(10) Patent No.: US 12,414,431 B2
(45) Date of Patent: Sep. 9, 2025

(54) ORGANIC LIGHT-EMITTING ELEMENT, LIGHT-EMITTING DEVICE, AND LIGHT-EMITTING METHOD

(71) Applicants: HAMAMATSU PHOTONICS K.K., Hamamatsu (JP); KYUSHU UNIVERSITY, NATIONAL UNIVERSITY CORPORATION, Fukuoka (JP)

(72) Inventors: Takahiko Yamanaka, Hamamatsu (JP); Shigeo Hara, Hamamatsu (JP); Chihaya Adachi, Fukuoka (JP); Hajime Nakanotani, Fukuoka (JP)

(73) Assignees: HAMAMATSU PHOTONICS K.K., Hamamatsu (JP); KYUSHU UNIVERSITY, NATIONAL UNIVERSITY CORPORATION, Fukuoka (JP)

( * ) Notice: Subject to any disclaimer, the term of this patent is extended or adjusted under 35 U.S.C. 154(b) by 558 days.

(21) Appl. No.: 17/883,770

(22) Filed: Aug. 9, 2022

(65) Prior Publication Data
US 2023/0053098 A1   Feb. 16, 2023

(30) Foreign Application Priority Data

Aug. 16, 2021 (JP) ................. 2021-132302
May 27, 2022 (JP) ................. 2022-086925

(51) Int. Cl.
| | |
|---|---|
| *H10K 50/18* | (2023.01) |
| *H05B 45/60* | (2022.01) |
| *H10K 50/15* | (2023.01) |
| *H10K 101/30* | (2023.01) |
| *H10K 102/00* | (2023.01) |

(52) U.S. Cl.
CPC ............ *H10K 50/18* (2023.02); *H05B 45/60* (2020.01); *H10K 50/15* (2023.02); *H10K 2101/30* (2023.02); *H10K 2102/351* (2023.02)

(58) Field of Classification Search
CPC .... H10K 50/18; H10K 50/15; H10K 2101/30; H10K 2102/351; H10K 2101/40; H05B 45/60
See application file for complete search history.

(56) References Cited

U.S. PATENT DOCUMENTS

2021/0036256 A1* 2/2021 Adachi ................. H10K 71/00

FOREIGN PATENT DOCUMENTS

| | | |
|---|---|---|
| JP | 5366106 B1 | 12/2013 |
| JP | 2021-027330 A | 2/2021 |

* cited by examiner

*Primary Examiner* — Mohammad A Rahman
(74) *Attorney, Agent, or Firm* — Faegre Drinker Biddle & Reath LLP

(57) ABSTRACT

Provided is an organic light-emitting element that is excited by an electromagnetic wave. The organic light-emitting element includes: a first electrode; a second electrode disposed to face the first electrode; an organic light-emitting layer disposed between the first electrode and the second electrode, where separation of charges occurs due to incidence of the electromagnetic wave; a hole transporting layer disposed between the first electrode and the organic light-emitting layer; and a charge block layer disposed between the second electrode and the organic light-emitting layer. The charge block layer has a LUMO level shallower than a LUMO level of organic light emitters included in the organic light-emitting layer.

15 Claims, 40 Drawing Sheets

ORGANIC LIGHT-EMITTING ELEMENT, LIGHT-EMITTING DEVICE, AND LIGHT-EMITTING METHOD

TECHNICAL FIELD

The present disclosure relates to an organic light-emitting element that is excited by an electromagnetic wave, a light-emitting device including the organic light-emitting element that is excited by an electromagnetic wave, and a light-emitting method using organic light-emitting element that is excited by an electromagnetic wave.

BACKGROUND

Japanese Unexamined Patent Publication No. 2021-027330 discloses an organic light-emitting element including a first electrode, a second electrode disposed to face the first electrode, an organic light-emitting layer which is disposed between the first electrode and the second electrode and in which separation of charges occurs due to incidence of excitation light, and a charge inflow blocking layer that is disposed at least one side between the first electrode and the organic light-emitting layer and between the second electrode and the organic light-emitting layer.

SUMMARY

According to the organic light-emitting element described in Japanese Unexamined Patent Publication No. 2021-027330, in a second period after elapse of a delay period from a first period for which excitation light is incident to the organic light-emitting layer, when a potential difference between the first electrode and the second electrode is caused to vary so that recoupling of charges occurs, light emission from the organic light-emitting layer can be obtained in the second period. The organic light-emitting element is effective from the viewpoint that a new light emission aspect can be realized, but will be further effective when light emission with a high peak intensity and a high response speed can be obtained.

An object of the present disclosure is to provide an organic light-emitting element, a light-emitting device, and a light-emitting method which are capable of obtaining light emission with a high peak intensity and a high response speed.

According to an aspect of the present disclosure, there is provided "an organic light-emitting element that is excited by electromagnetic wave. The organic light-emitting element includes: a first electrode; a second electrode disposed to face the first electrode; an organic light-emitting layer disposed between the first electrode and the second electrode, where separation of charges occurs due to incidence of the electromagnetic wave; a hole transporting layer disposed between the first electrode and the organic light-emitting layer; and a charge block layer disposed between the second electrode and the organic light-emitting layer. The charge block layer has a LUMO level shallower than a LUMO level of organic light emitters included in the organic light-emitting layer".

DETAILED DESCRIPTION

Figure 1:
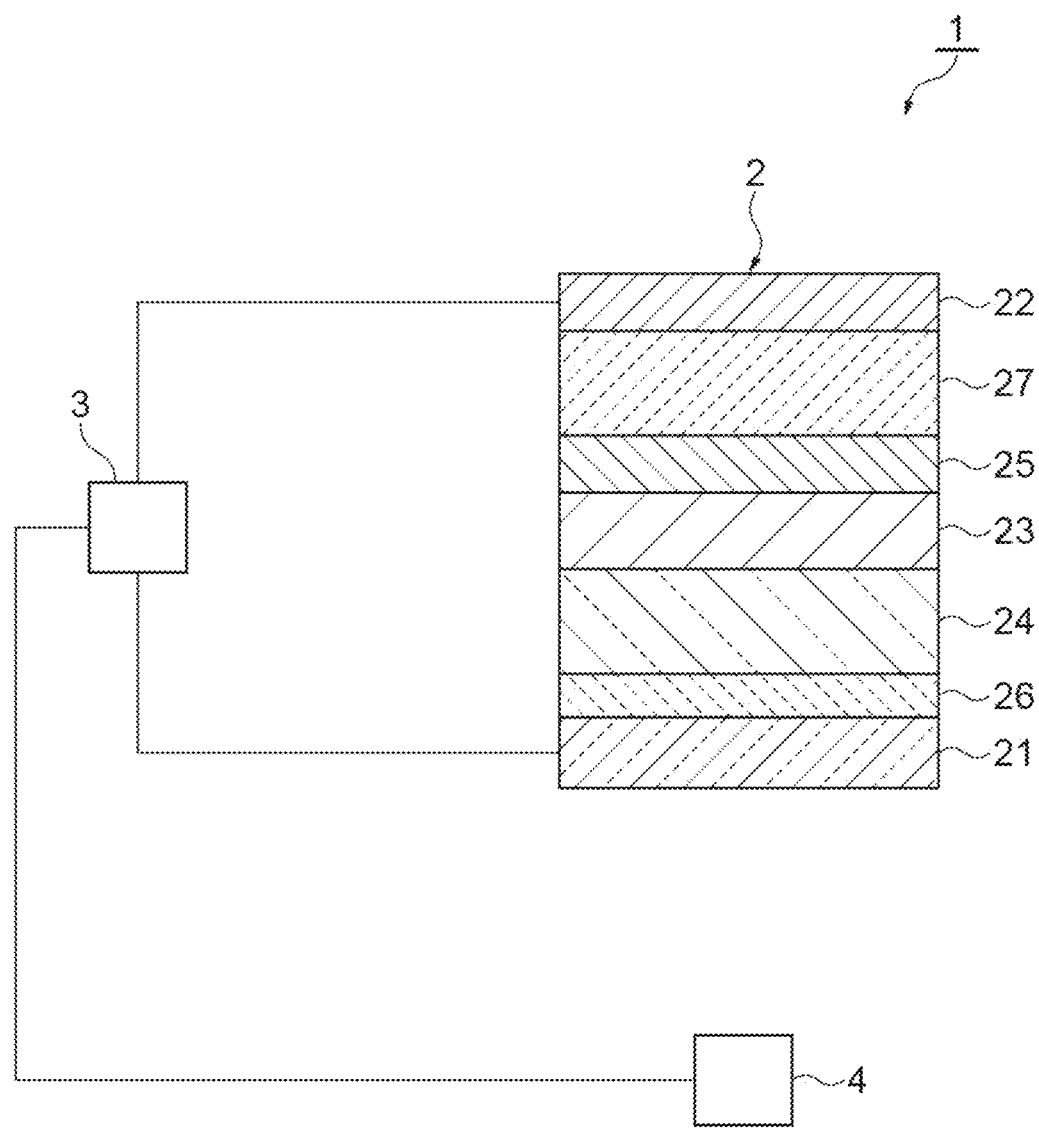
FIG. 1 is a configuration diagram of a light-emitting device of an embodiment.

Hereinafter, embodiments of the present disclosure will be described in detail with reference to the accompanying drawings. Note that, in the respective drawings, the same reference numeral will be given to the same or equivalent portion, and redundant description thereof will be omitted.
[Configuration of Light-Emitting Device]

As shown in FIG. 1, a light-emitting device 1 includes an organic light-emitting element 2, a controller 3, and a light source 4. The controller 3 controls the organic light-emitting element 2 and the light source 4. For example, the controller 3 is constituted by an integrated circuit such as a function generator (an arbitrary waveform output device) and FPGA, and the like. The light source 4 emits excitation light. The organic light-emitting element 2 is irradiated with the excitation light emitted from the light source 4. For example, the light source 4 is constituted by an LED or the like.
[Configuration of Organic Light-Emitting Element]

The organic light-emitting element 2 includes a first electrode 21, a second electrode 22, an organic light-emitting layer 23, a hole transporting layer 24, a charge block layer 25, an injection layer 26, and a buffer layer 27. In the organic light-emitting element 2, the first electrode 21, the injection layer 26, the hole transporting layer 24, the organic light-emitting layer 23, the charge block layer 25, the buffer layer 27, and the second electrode 22 are stacked in this order on a light-transmitting substrate (not shown) formed from, for example, glass or the like. That is, in the organic light-emitting element 2, the second electrode 22 is disposed to face the first electrode 21, and the organic light-emitting layer 23 is disposed between the first electrode 21 and the second electrode 22. In addition, in the organic light-emitting element 2, the hole transporting layer 24 is disposed between the first electrode 21 and the organic light-emitting layer 23, and the charge block layer 25 is disposed between the second electrode 22 and the organic light-emitting layer 23.

The first electrode 21 is a layer formed from a material (for example, ITO or the like) having conductivity and a light-transmitting property. The first electrode 21 has a light-transmitting property with respect to excitation light that is incident to the organic light-emitting layer 23 from the outside and light that is emitted to the outside from the organic light-emitting layer 23. The second electrode 22 is a layer formed from a material having conductivity (for example, aluminum or the like). In this embodiment, a work function (a depth (absolute value) from a vacuum level) of the second electrode 22 is smaller than a work function of the first electrode 21. For example, in a case where the first electrode 21 is formed from ITO, and the second electrode 22 is formed from LiQ/Al, the work function of the first electrode 21 is approximately 4.8 eV, and the work function of the second electrode 22 is approximately 4.0 eV or less.

The injection layer 26 is a layer that reduces a hole injection barrier at an interface of the first electrode 21. For example, the injection layer 26 is formed from a metal oxide such as HAT-CN, a molybdenum oxide, a tungsten oxide, a nickel oxide, a vanadium oxide, a conductive polymer represented by PEDOT:PSS, or the like. The buffer layer 27 is a layer that reduces resistance between the charge block layer 25 and the second electrode 22. For example, the buffer layer 27 is formed from an electron transporting material such as a nitro-substituted fluorene derivative, a diphenylquinone derivative, a thiopyrandioxide derivative, carbodiimide, a fluorenylidene methane derivative, a triphenylene derivative (BPy-TP2 or the like), anthraquinodimethane and anthrone derivatives, an oxadiazole derivative, a thiadiazole derivative, a quinoxaline derivative, a triazine derivative, a phenanthroline derivative, a benzoimidazole derivative, and a chelate complex, or a hole transporting material such as a triazole derivative, an imidazole derivative, a carbazole derivative, an indolocarbazole derivative, a polyarylalkane derivative, a pyrazoline derivative, a pyrazolone derivative, a phenylenediamine derivative, an arylamine derivative, a diphenylamine derivative, a triphenylamine derivative, an amino-substituted chalcone derivative, an oxazole derivative, a styryl anthracene derivative, a fluorenone derivative, a hydrazone derivative, a stilbene derivative, a silazane derivative, an aniline-based copolymer, and a conductive polymer oligomer.

The hole transporting layer 24 is a layer that promotes hole movement from the first electrode 21 to the organic light-emitting layer 23, and hole movement from the organic light-emitting layer 23 to the first electrode 21. The hole transporting layer 24 has a light-transmitting property with respect to excitation light that is incident to the organic light-emitting layer 23 from the outside, and light that is emitted from the organic light-emitting layer 23 to the outside as in the first electrode 21. For example, the hole transporting layer 24 is formed from a hole transporting material such as a triazole derivative, an imidazole derivative, a carbazole derivative (CBP, Tris-PCz, or the like), an indolocarbazole derivative, a polyarylalkane derivative, a pyrazoline derivative, a pyrazolone derivative, a phenylenediamine derivative, an arylamine derivative, a diphenylamine derivative (NPD or the like), a triphenylamine derivative (TAPC, TPT1, or the like), an amino-substituted chalcone derivative, an oxazole derivative, a styryl anthracene derivative, a fluorenone derivative, a hydrazone derivative, a stilbene derivative, a silazane derivative, an aniline-based copolymer, and a conductive polymer oligomer. In this embodiment, the hole transporting layer 24 has a thickness so that a distance between the first electrode 21 and the charge block layer 25 becomes 400 nm or less. The charge block layer 25 is a layer that blocks movement of charges (electrons and holes) from the second electrode 22 to the organic light-emitting layer 23, and movement of charges from the organic light-emitting layer 23 to the second electrode 22. For example, the charge block layer 25 is formed from an electron transporting material such as a triazine derivative (T2T or the like), a phenanthroline derivative (Bphen, BCP, or the like), a benzoimidazole derivative (TPBi or the like), a nitro-substituted fluorene derivative, a diphenylquinone derivative, a thiopyrandioxide derivative, carbodiimide, fluorenylidene methane derivative, a triphenylene derivative, anthraquinodimethane and anthrone derivatives, an oxadiazole derivative, a thiadiazol derivative, a quinoxaline derivative and a chelate complex (BAlq or the like).

The organic light-emitting layer 23 is a layer in which separation of charges occurs due to incidence of excitation light. In this embodiment, the organic light-emitting layer 23 is constituted by a host material (for example, mCBP or the like) including organic light emitters in which separation of charges occurs due to incidence of excitation light. In the organic light-emitting layer 23, for example, TPA-DCPP, 4CzIPN, Alq3, TBRb, 4CzTPN-Ph, or the like is used as the organic light emitters.

Dipole moment (p) of the "organic light emitter in which separation of charges occurs due to incidence of excitation light" included in the organic light-emitting layer 23 may be greater than 0 D. According to this, energy for separation of charges can be reduced. As an example, dipole moment of TPA-DCPP is 13.05 D, dipole moment of 4CzIPN is 3.85 D, dipole moment of Alq3 is 4.40 D, and dipole moment of TBRb is 0.16 D. The dipole moment is a value that can be calculated by quantum chemical calculation, and is a value that is generally calculated by a calculation method called a Hartree-Fock (HF) method or a density functional theory (DFT) method. Among these, the most commonly used condition (combination of a functional and a basis function) is B3LYP/6-31(d).

The "organic light emitter in which separation of charges occurs due to incidence of excitation light" included in the organic light-emitting layer 23 may include a functional group having an electron donating property (donor) and a functional group having an electron accepting property (acceptor), for example, as in molecules described in Japanese Patent No. 5366106. According to this, high charge separation efficiency is likely to be obtained.

Figure 2:
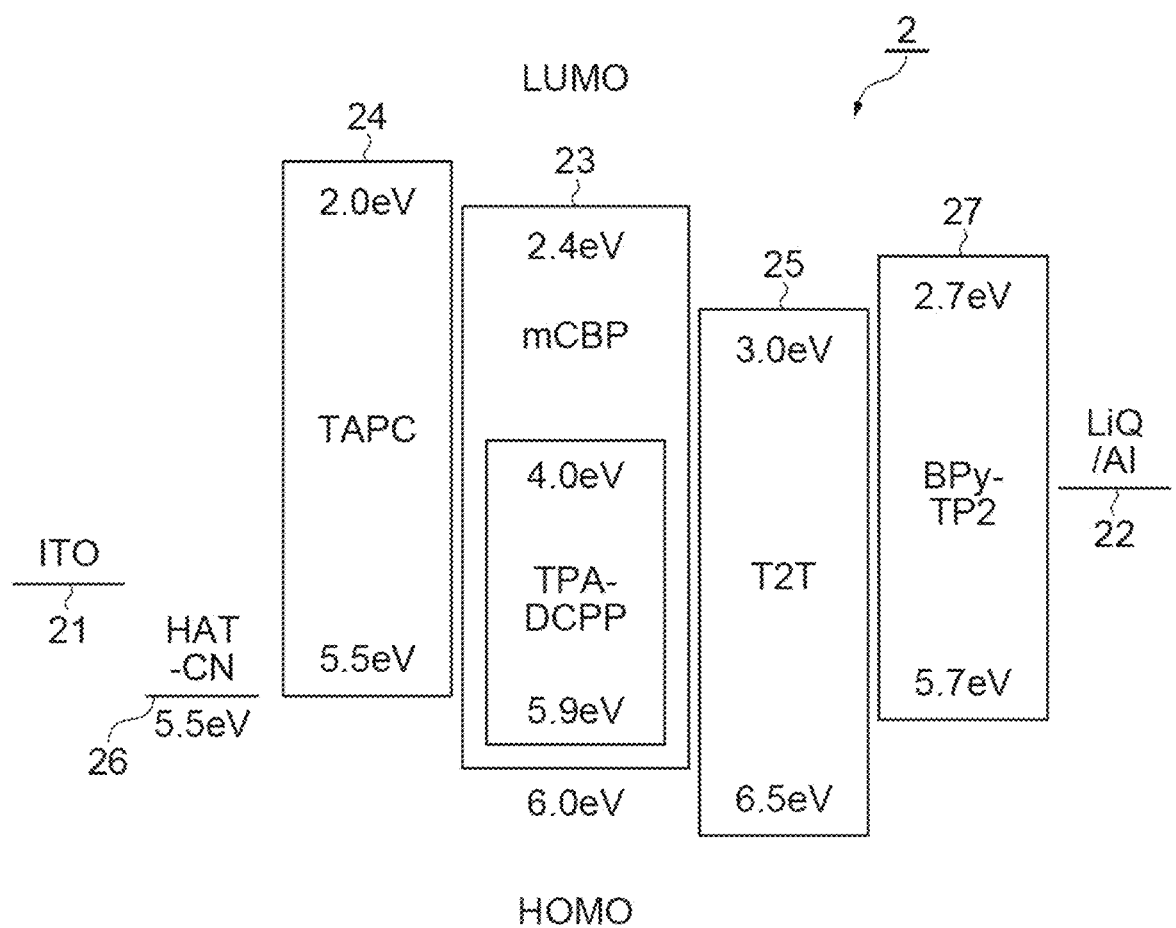
FIG. 2 is an energy diagram of an example of an organic light-emitting element shown in FIG. 1.

FIG. 2 is an energy diagram of an example of the organic light-emitting element 2. In the example, the first electrode 21 is formed from ITO, the second electrode 22 is formed from LiQ/Al, the organic light-emitting layer 23 is formed from TPA-DCPP (organic light emitter) and mCBP (host material), the hole transporting layer 24 is formed from TAPC, the charge block layer 25 is formed from T2T, the injection layer 26 is formed from HAT-CN, and the buffer layer 27 is formed from BPy-TP2.

As shown in FIG. 2, the hole transporting layer 24 has a LUMO level (in FIG. 2, 2.0 eV) shallower than a LUMO level (in FIG. 2, 4.0 eV) of the organic light emitters included in the organic light-emitting layer 23. The hole transporting layer 24 has a HOMO level (in FIG. 2, 5.5 eV) shallower than a HOMO level (in FIG. 2, 5.9 eV) of the organic light emitters included in the organic light-emitting layer 23. The charge block layer 25 has a LUMO level (in FIG. 2, 3.0 eV) shallower than the LUMO level (in FIG. 2, 4.0 eV) of the organic light emitters included in the organic light-emitting layer 23. The charge block layer 25 has a HOMO level (in FIG. 2, 6.5 eV) deeper than the HOMO level (in FIG. 2, 5.9 eV) of the organic light emitters included in the organic light-emitting layer 23. Note that, the hole transporting layer 24 may have a LUMO level deeper than the LUMO level of the organic light emitters. In addition, the hole transporting layer 24 may have a HOMO level deeper than the HOMO level of the organic light emitters. The hole transporting layer 24 having the LUMO level shallower than the LUMO level of the organic light emitters may have a HOMO level shallower than the HOMO level of the organic light emitters, or may have a HOMO level deeper than HOMO level of the organic light emitters. In addition, the hole transporting layer 24 having the LUMO level deeper than the LUMO level of the organic light emitters may have a HOMO level shallower than the HOMO level of the organic light emitters, or may have a HOMO level deeper than the HOMO level of the organic light emitters.

The LUMO level and the HOMO level are negative values. A state in which one LUMO level is shallower than the other LUMO level represents that an absolute value of the one LUMO level is smaller than an absolute value of the other LUMO level, and a state in which one LUMO level is deeper than the other LUMO level represents that an absolute value of the one LUMO level is larger than an absolute value of the other LUMO level. A state in which one HOMO level is shallower than the other HOMO level represents that an absolute value of the one HOMO level is smaller than an absolute value of the other HOMO level, and a state in which one HOMO level is deeper than the other HOMO level represents that an absolute value of the one HOMO level is greater than an absolute value of the other HOMO level.

Note that, the HOMO level and the LUMO level of a material can be measured by the following method. A material of an object to be measured is formed on As-doped n-type bear Si wafer that is subjected to surface mirror finishing, has resistivity of 0.0030 to 0.0060 Ω·cm, and has a crystal orientation of <100>, and the HOMO level of the material is measured by photoemission yield spectroscopy in air AC-3E (manufactured by RIKEN KEIKI Co., Ltd.). It is preferable that the film thickness of the material is approximately 100 nm, but may be approximately 30 nm in a case of forming a film by a spin coat method.

On the other hand, a material of an object to be measured is formed on a quartz substrate, and an absorption spectrum of the material is measured by UV-VIS-NIR spectrophotometer LAMBDA950 (manufactured by PerkinElmer, Inc.). At this time, a film thickness of the material is adjusted so that an absorption peak on the longest wavelength side becomes an optical density (OD) of 0.1 to 1.0. In a case where the material is the organic light emitters, an absorption maximum value on the longest wavelength side is set as $P_{Abs}$. Next, a wavelength of an intersection of a tangential line with respect to the falling on a long wavelength side in an absorption peak on the longest wavelength side and the horizontal axis (wavelength axis) is set as $\lambda_{edge}$ [nm]. The tangential line is a tangential line in which a value of inclination becomes the maximum value among tangential lines at respective points on a curved line of an absorption spectrum from the long wavelength side of the absorption peak to the maximum value. Next, a value of the HOMO level is calculated by an equation of LUMO [eV]=HOMO [eV]+(1240/$\lambda_{edge}$ [nm]) by using the value of HOMO level [eV] measured by the above-described method.

[Light-Emitting Method performed in Light-Emitting Device]

Description will be given of the light-emitting method (that is, a light-emitting method using the organic light-emitting element 2) that is performed in the light-emitting device 1. As will be described below, the organic light-emitting element 2 is a light excitation type organic light-emitting element that emits light when a forward electric field is applied to the organic light-emitting layer 23 that is in an excited state due to incidence of excitation light.

Figure 3A:
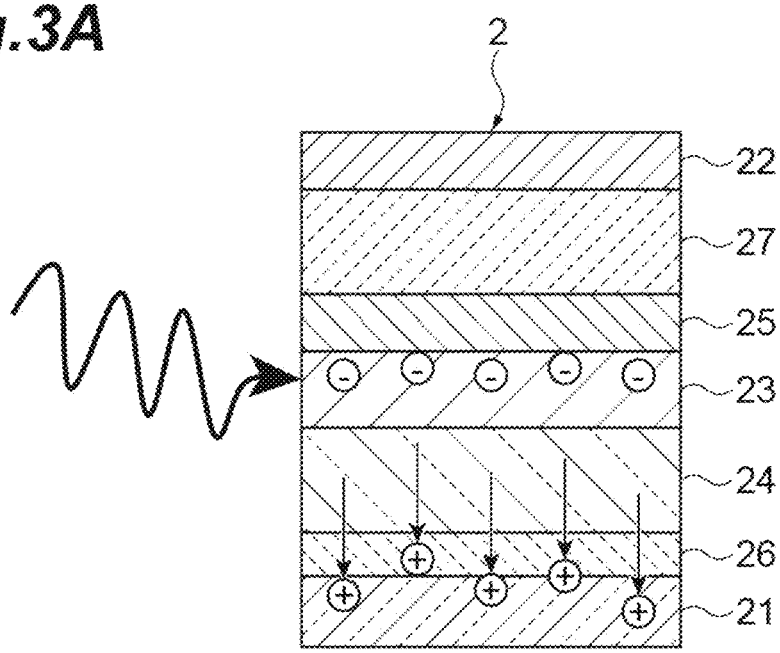
FIG. 3A and FIG. 3B are cross-sectional views of the organic light-emitting element shown in FIG. 1.

First, the controller 3 controls the light source 4, and causes excitation light to be incident to the organic light-emitting layer 23 that is in a normal state in a first period (a step where an electromagnetic wave is incident). The excitation light emitted from the light source 4 is transmitted through a light-transmitting substrate, the first electrode 21, the injection layer 26, and the hole transporting layer 24, and is incident to the organic light-emitting layer 23. Note that, in the normal state, separation of charges does not occur in the organic light-emitting layer 23, and electrons and holes generated by separation of charges do not exist in the organic light-emitting layer 23. In the first period, when excitation light is incident to the organic light-emitting layer 23, as shown in FIG. 3A, separation of charges occurs in the organic light-emitting layer 23, and electrons and holes are generated. More specifically, molecules of TPA-DCPP in the organic light-emitting layer 23 enter an excited state due to incidence of the excitation light, some of the molecules emit light and return to a ground state, but the remaining molecules do not emit light and separation of charges occurs. Electrons generated by separation of charges is suppressed from moving to the second electrode 22 due to the charge block layer 25, and remains in the organic light-emitting layer 23. Electrons generated by separation of charges are trapped, for example, by TPA-DCPP in the organic light-emitting layer 23. Holes generated by separation of charges move to the first electrode 21 through the hole transporting layer 24.

Figure 3B:
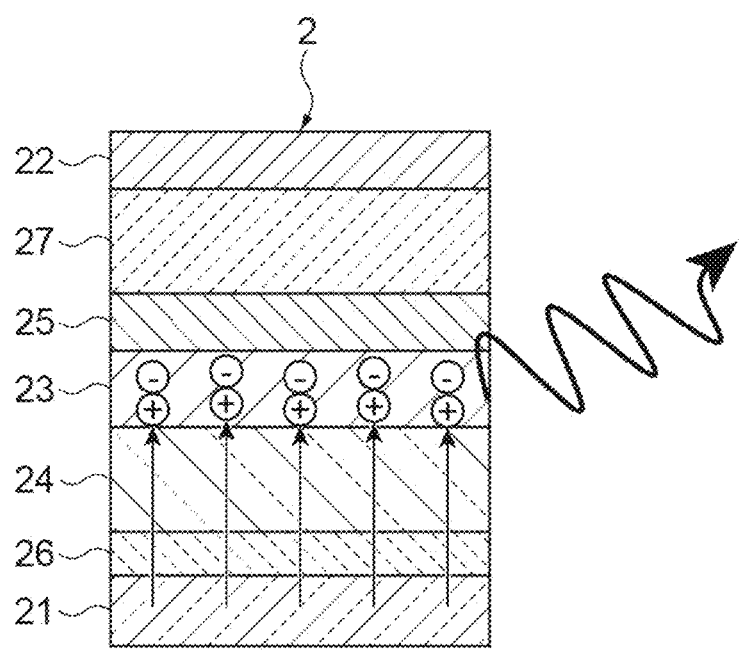

Next, in a second period after passage of a delay period from the first period, the controller 3 causes a potential difference between the first electrode 21 and the second electrode 22 to vary so that recoupling of charges occurs (a step where a potential difference is caused to vary). In this embodiment, the second period is a period of 100 ns to 100 µs. In the second period, when the potential difference between the first electrode 21 and the second electrode 22 varies, as shown in FIG. 3B, holes move from the first electrode 21 to the organic light-emitting layer 23 through the hole transporting layer 24, and are recoupled to the electrons remained in the organic light-emitting layer 23, and thus light is emitted from the organic light-emitting layer 23 to the outside. Typically, hole mobility in the organic light-emitting layer 23 is higher than electron mobility in the organic light-emitting layer 23. Accordingly, when electrons of which mobility is relatively low are caused to remain in the organic light-emitting layer 23, holes of which mobility is relatively high are caused to move to the organic light-emitting layer 23, and the holes and the electrons are coupled, light emission with a high peak intensity occurs at a high response speed. Here, the delay period represents a period from termination of the first period to initiation of the second period.

In this embodiment, the controller 3 applies a voltage between the first electrode 21 and the second electrode 22 so that a reverse electric field occurs in the organic light-emitting layer 23 (so that a potential of the first electrode 21 becomes negative with a potential of the second electrode 22 set as a reference in the example shown in FIG. 2) in the first period and the delay period, and applies a voltage between the first electrode 21 and the second electrode 22 so that a forward electric field occurs in the organic light-emitting layer 23 (so that the potential of the first electrode 21 becomes positive with the potential of the second electrode 22 set as a reference in the example shown in FIG. 2) in the second period. Here, the forward electric field represents an electric field in a direction where recoupling of charges is caused to occur, and the reverse electric field represents an electric field in a direction reverse to the forward electric field. Note that, the controller 3 may set the potential differential between the first electrode 21 and the second electrode 22 to 0 in the first period and the delay period, and may apply a voltage between the first electrode 21 and the second electrode 22 so that the forward electric field occurs in the organic light-emitting layer 23 in the second period.

[Operation and Effect]

In the organic light-emitting element 2, the hole transporting layer 24 is disposed between the first electrode 21 and the organic light-emitting layer 23, and the charge block layer 25 having a LUMO level shallower than a LUMO level of the organic light emitters included in the organic light-emitting layer 23 is disposed between the second electrode 22 and the organic light-emitting layer 23. According to this, for example, in a state in which a voltage has been applied between the first electrode 21 and the second electrode 22 so that the reverse electric field occurs in the organic light-emitting layer 23, when separation of charges occurs in the organic light-emitting layer 23 due to incidence of excitation light, electrons generated due to separation of charges are suppressed from moving to the second electrode 22 due to the charge block layer 25 and remain in the organic light-emitting layer 23, and holes generated due to separation of charges move to the first electrode 21 through the hole transporting layer 24. In this state, for example, when a voltage is applied between the first electrode 21 and the second electrode 22 so that the forward electric field occurs in the organic light-emitting layer 23, holes move from the first electrode 21 to the organic light-emitting layer 23 through the hole transporting layer 24, and are coupled to electrons remaining in the organic light-emitting layer 23. Typically, hole mobility in the organic light-emitting layer 23 is higher than electron mobility in the organic light-emitting layer 23. Accordingly, when electrons of which mobility is relatively low are caused to remain in the organic light-emitting layer 23, holes of which mobility is relatively high are caused to move to the organic light-emitting layer 23, and the holes and the electrons are coupled, light emission with a high peak intensity occurs at a high response speed. Accordingly, according to the organic light-emitting element 2, light emission with a high peak intensity and a high response speed can be obtained.

In the organic light-emitting element 2, the charge block layer 25 has HOMO level deeper than a HOMO level of the organic light emitters. According to this, for example, when a voltage has been applied between the first electrode 21 and the second electrode 22 so that the forward electric field occurs in the organic light-emitting layer 23, movement of holes, which have moved from the first electrode 21 to the organic light-emitting layer 23 through the hole transporting layer 24, to the second electrode 22 is suppressed due to the charge block layer 25. Accordingly, holes which have moved from the first electrode 21 to the organic light-emitting layer 23 through the hole transporting layer 24 can be effectively coupled to electrons remaining in the organic light-emitting layer 23.

In the organic light-emitting element 2, the hole transporting layer 24 has a thickness so that a distance between the first electrode 21 and the charge block layer 25 becomes 400 nm or less. According to this, for example, in a state in which a voltage has been applied between the first electrode 21 and the second electrode 22 so that the reverse electric field occurs in the organic light-emitting layer 23, when separation of charges occurs in the organic light-emitting layer 23 due to incidence of excitation light, electrons generated due to separation of charges can be sufficiently accumulated in the organic light-emitting layer 23.

According to the light-emitting device 1 including the organic light-emitting element 2, and the light-emitting method using the organic light-emitting element 2, as described above, light emission with a high peak intensity and a high response speed can be obtained in the organic light-emitting element 2.

In the light-emitting device 1, the controller 3 applies a voltage between the first electrode 21 and the second electrode 22 so that the reverse electric field occurs in the organic light-emitting layer 23 in the first period and the delay period, and applies a voltage between the first electrode 21 and the second electrode 22 in the second period so that the forward electric field occurs in the organic light-emitting layer 23. According to this, light emission with a high peak intensity and a high response speed can be more reliably obtained in the organic light-emitting element 2.

In the light-emitting device 1, the second period is a period of 100 ns to 100 µs. According to this, light emission with a high peak intensity and a high response speed can be more reliably obtained in the organic light-emitting element 2.

In the light-emitting device 1, the controller 3 controls the light source 4 so that excitation light is incident to the organic light-emitting layer 23 in the first period. According to this, the organic light-emitting layer 23 can easily and reliably enter an excited state (that is, a state in which electrons generated due to separation of charges remain).

[Experimental Results]

Experimental results will be described with reference to FIG. 4A to FIG. 26. In the following description, a potential difference between the first electrode 21 and the second electrode 22 is simply referred to as "potential difference". In addition, application of a voltage between the first electrode 21 and the second electrode 22 so that the potential of the first electrode 21 becomes +5 V with the potential of the second electrode 22 set as a reference to cause the forward electric field to occur in the organic light-emitting layer 23 is noted as "application of a forward voltage of +5 V". In addition, application of a voltage between the first electrode 21 and the second electrode 22 so that the potential of the first electrode 21 becomes −10 V with the potential of the second electrode 22 set as a reference to cause the reverse electric field to occur in the organic light-emitting layer 23 is noted as "application of a reverse voltage of −10 V". Note that, all findings obtained from the following experimental results are applicable to the organic light-emitting element, the light-emitting device, and the light-emitting method in this specifications in an arbitrary manner (that is, by selecting an arbitrary finding or by selecting arbitrary two or more findings).

The organic light-emitting element 2 (hereinafter, referred to as "an organic light-emitting 2 having a base structure") that is used to obtain experimental results shown in FIG. 4A to FIG. 22, and FIG. 24A to FIG. 26 is manufactured as follows. First, a glass substrate on which the first electrode 21 that is formed from ITO and has a thickness of 100 nm is formed was prepared, the injection layer 26 that is formed from HAT-CN and has a thickness of 10 nm was formed on the first electrode 21 by a vacuum evaporation method, and the hole transporting layer 24 that is formed from TACP and has a thickness of 50 nm was formed on the injection layer 26 by the vacuum evaporation method. Next, the organic light-emitting layer 23 that is formed from mCBP (host material) and TPA-DCPP (organic light emitter) and has a thickness of 30 nm was formed on the hole transporting layer 24 by a co-evaporation method from a different evaporation source. At this time, a mass ratio between mCBP and TPA-DCPP was set to 50:50. Next, the charge block layer 25 that is formed from T2T and has a thickness of 20 nm was formed on the organic light-emitting layer 23 by the vacuum evaporation method, and the buffer layer 27 that is formed from BPy-TP2 and has a thickness of 60 nm was formed on the charge block layer 25 by the vacuum evaporation method. Next, the second electrode 22 that is formed from LiQ having a thickness of 2 nm and Al having a thickness of 100 nm was formed on the buffer layer 27 by the vacuum evaporation method.

Figure 4A:
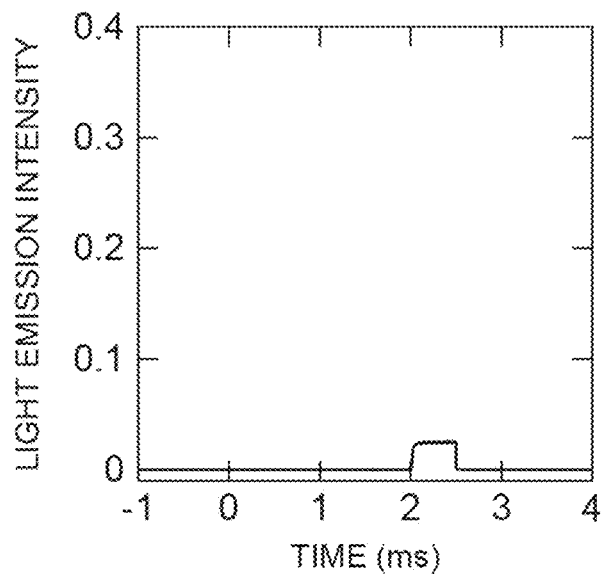
FIG. 4A and FIG. 4B are graphs showing experimental results.
Figure 4B:
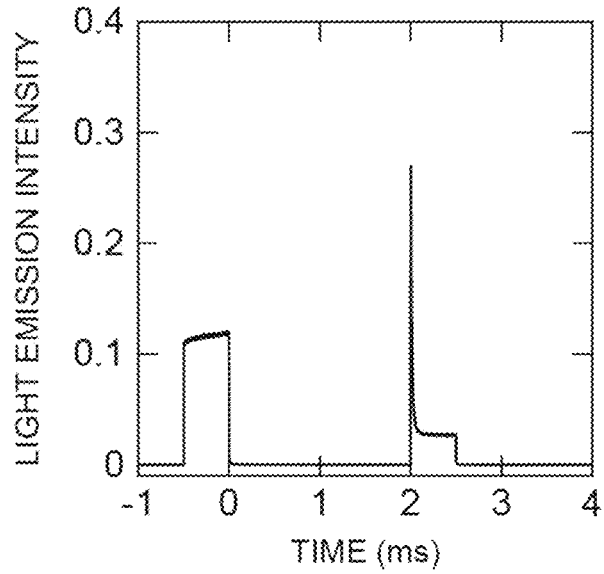

FIG. 4A is a graph showing a temporal variation of a light emission intensity "in a case where excitation light is not incident to the organic light-emitting layer 23 while applying a reverse voltage of −6 V in a period up to 2 ms, and a forward voltage of +3 V is applied in the second period of 2 to 2.5 ms". In this case, in the light emission intensity of the second period, blunt rising derived by a time constant of the organic light-emitting layer 23 was observed. FIG. 4B is a graph showing a temporal variation of the light emission intensity "in a case where excitation light is incident to the organic light-emitting layer 23 while applying a reverse voltage of −6 V in the first period of −0.5 to 0 ms, application of the reverse voltage of −6 V is maintained in a delay period of 0 to 2 ms, and a forward voltage of +3 V is applied in the second period of 2 to 2.5 ms". In this case, overshot was observed in the light emission intensity immediately after boosting in the second period, and the peak intensity greatly increased in comparison to the case shown in FIG. 4A.

Figure 5A:
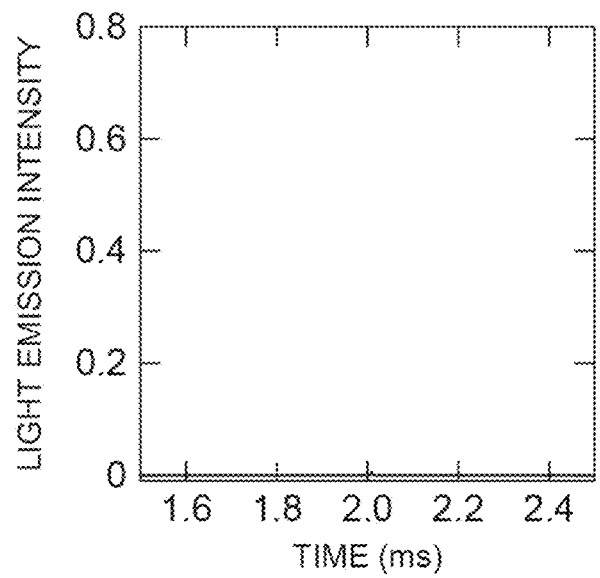
FIG. 5A and FIG. 5B are graphs showing experimental results.
Figure 5B:
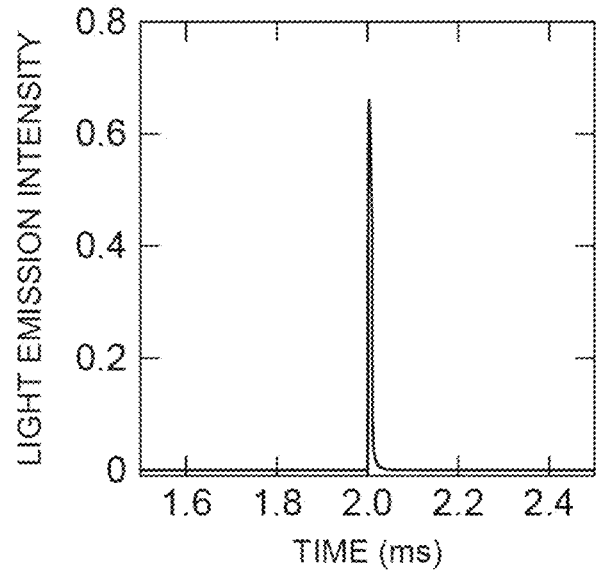

FIG. 5A is a graph showing a temporal variation of the light emission intensity "in a case where excitation light is not incident to the organic light-emitting layer 23 while applying a reverse voltage of −6 V in a period up to 2 ms, and a forward voltage of +3 V is applied in the second period of 2 to 2.01 ms (that is, a pulse width of 10 µs)". FIG. 5B is a graph showing a temporal variation of the light emission intensity "in a case where excitation light is incident to the organic light-emitting layer 23 while applying a reverse voltage of −6 V in a predetermined first period, application of the reverse voltage of −6 V is maintained in a delay period up to 2 ms, and a forward voltage of +3 V is applied in the second period of 2 to 2.01 ms (that is, a pulse width of 10 µs)".

Figure 6A:
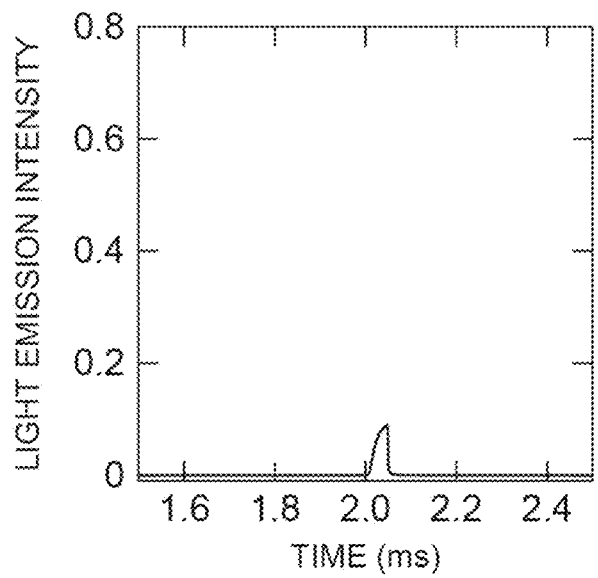
FIG. 6A and FIG. 6B are graphs showing experimental results.
Figure 6B:
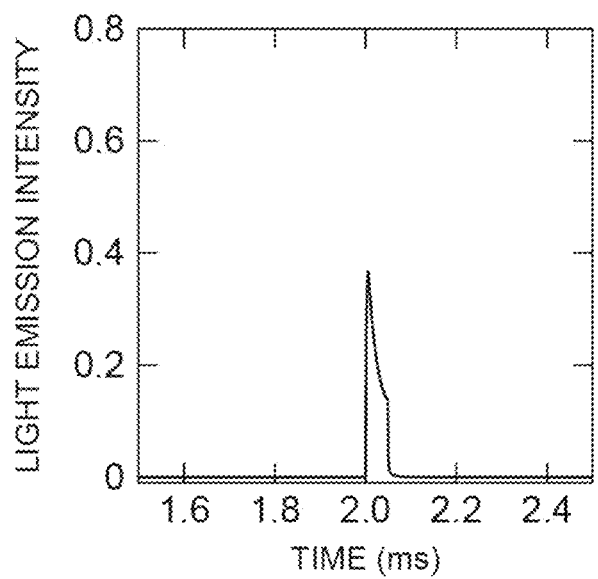

FIG. 6A is a graph showing a temporal variation of the light emission intensity "in a case where excitation light is not incident to the organic light-emitting layer 23 while applying a reverse voltage of −6 V in a period up to 2 ms, and a forward voltage of +3 V is applied in the second period of 2 to 2.05 ms (that is, a pulse width of 50 µs)". FIG. 6B is a graph showing a temporal variation of the light emission intensity "in a case where excitation light is incident to the organic light-emitting layer 23 while applying a reverse voltage of −6 V in a predetermined first period, application of the reverse voltage of −6 V is maintained in a delay period up to 2 ms, and a forward voltage of +3 V is applied in the second period of 2 to 2.05 ms (that is, a pulse width of 50 µs)".

Figure 7A:
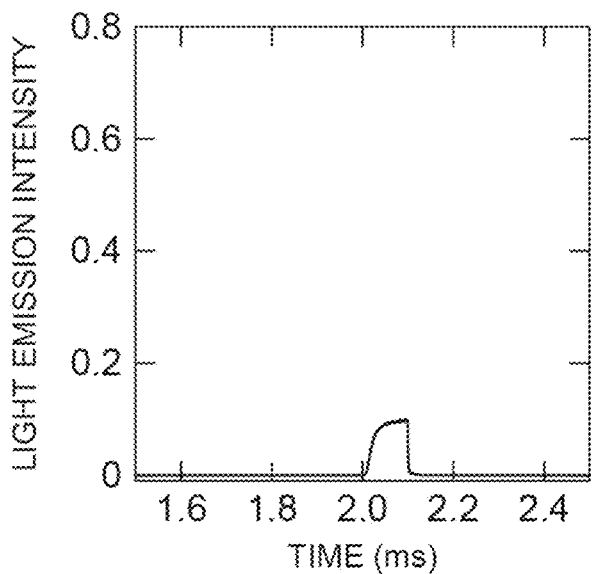
FIG. 7A and FIG. 7B are graphs showing experimental results.
Figure 7B:
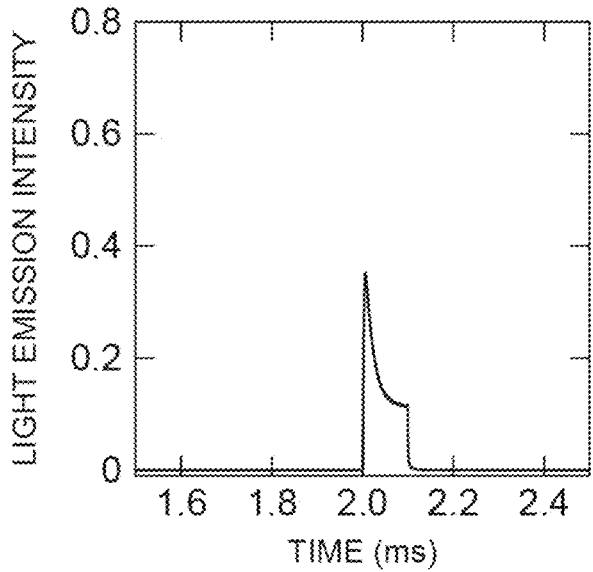

FIG. 7A is a graph showing a temporal variation of the light emission intensity "in a case where excitation light is not incident to the organic light-emitting layer 23 while applying a reverse voltage of −6 V in a period up to 2 ms, and a forward voltage of +3 V is applied in the second period of 2 to 2.1 ms (that is, a pulse width of 100 µs)". FIG. 7B is a graph showing a temporal variation of the light emission intensity "in a case where excitation light is incident to the organic light-emitting layer 23 while applying a reverse voltage of −6 V in a predetermined first period, application of the reverse voltage of −6 V is maintained in a delay period up to 2 ms, and a forward voltage of +3 V is applied in the second period of 2 to 2.1 ms (that is, a pulse width of 100 µs)".

Figure 8A:
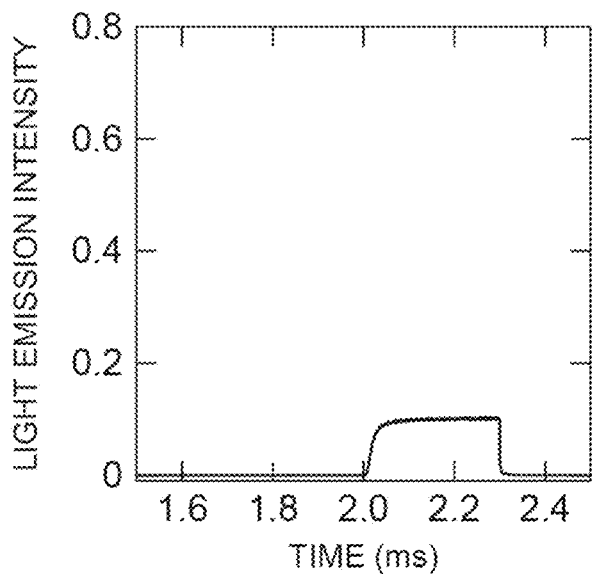
FIG. 8A and FIG. 8B are graphs showing experimental results.
Figure 8B:
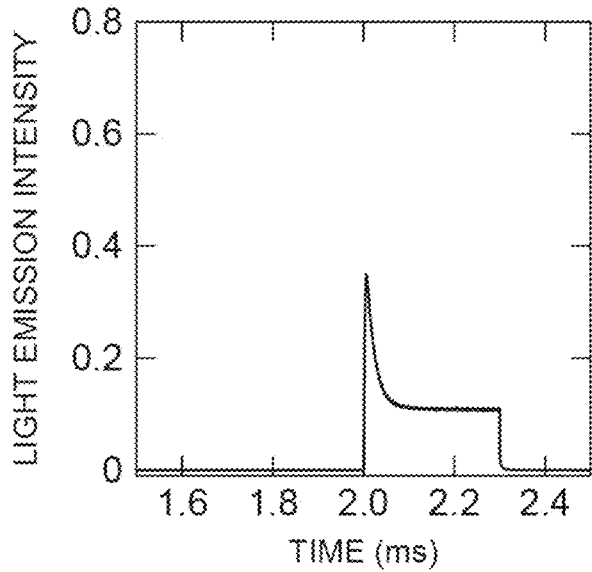

FIG. 8A is a graph showing a temporal variation of the light emission intensity "in a case where excitation light is not incident to the organic light-emitting layer 23 while applying a reverse voltage of −6 V in a period up to 2 ms, and a forward voltage of +3 V is applied in the second period of 2 to 2.3 ms (that is, a pulse width of 300 µs)". FIG. 8B is a graph showing a temporal variation of the light emission intensity "in a case where excitation light is incident to the organic light-emitting layer 23 while applying a reverse voltage of −6 V in a predetermined first period, application of the reverse voltage of −6 V is maintained in a delay period up to 2 ms, and a forward voltage of +3 V is applied in the second period of 2 to 2.3 ms (that is, a pulse width of 300 µs)".

From the experimental results shown in FIG. 5A to FIG. 8B, it could be seen that when the excitation light is not incident to the organic light-emitting layer 23, following is difficult in a pulse width of 10 µs or less, and light emission is not observed. On the other hand, it could be seen that when the excitation light is incident to the organic light-emitting layer 23, in accordance with shortening of a pulse width, a displacement current (AC current) component increases, an increase in peak intensity and an increase in response speed are observed, and following can be made even in a pulse width of 10 µs without any problem. The reason for this is considered because in addition to "electrons with relatively low mobility are caused to remain in the organic light-emitting layer 23, and holes with relatively high mobility are caused to move to the organic light-emitting layer 23", "electrons are caused to remain in the organic light-emitting layer 23, and thus holes which are counter charges are likely to be attracted by a Coulomb force". Note that, the response speed was evaluated with time until reaching 90% of the peak intensity after reaching 10% of the peak intensity in rising of the light emission intensity in the second period (the same shall apply hereinafter).

Figure 9A:
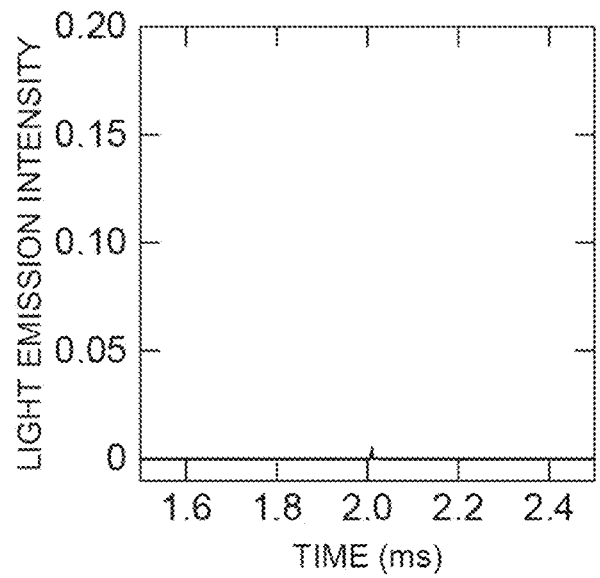
FIG. 9A and FIG. 9B are graphs showing experimental results.
Figure 9B:
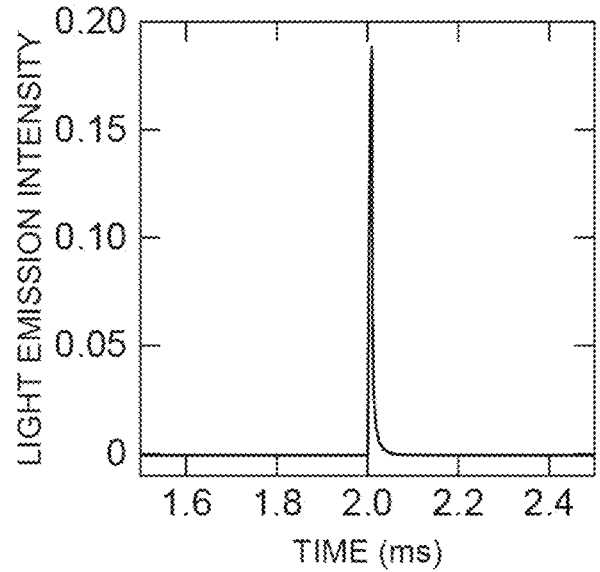

FIG. 9A is a graph showing a temporal variation of the light emission intensity "in a case where excitation light is not incident to the organic light-emitting layer 23 while setting a potential difference to 0 in a period up to 2 ms, and a forward voltage of +3 V is applied in the second period of 2 to 2.01 ms (that is, a pulse width of 10 µs)". FIG. 9B is a graph showing a temporal variation of the light emission intensity "in a case where excitation light is incident to the organic light-emitting layer 23 while setting a potential difference to 0 in a predetermined first period, a potential different in a delay period up to 2 ms is maintained to 0, and a forward voltage of +3 V is applied in the second period of 2 to 2.01 ms (that is, a pulse width of 10 µs)". From the experimental results shown in FIG. 9A and FIG. 9B, even in a case where the potential different to initiation of the second period is set to 0, it could be seen that when the excitation light is incident to the organic light-emitting layer 23, an increase in the peak intensity and an increase in the response speed are observed in the pulse width of 10 µs without any problem.

Figure 10A:
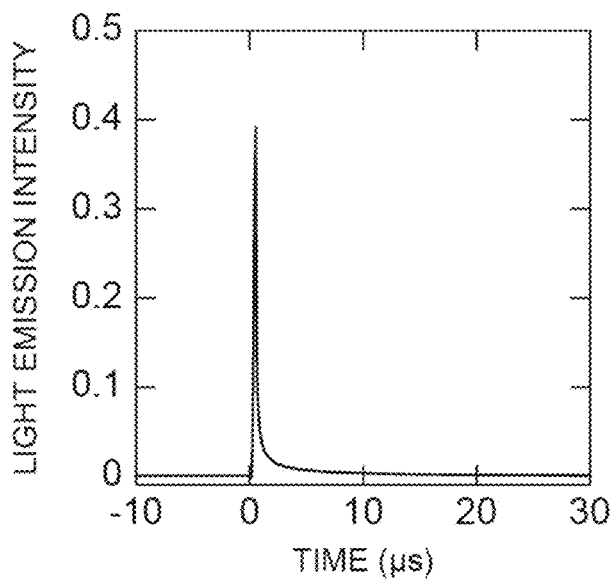
FIG. 10A and FIG. 10B are graphs showing experimental results.
Figure 10B:
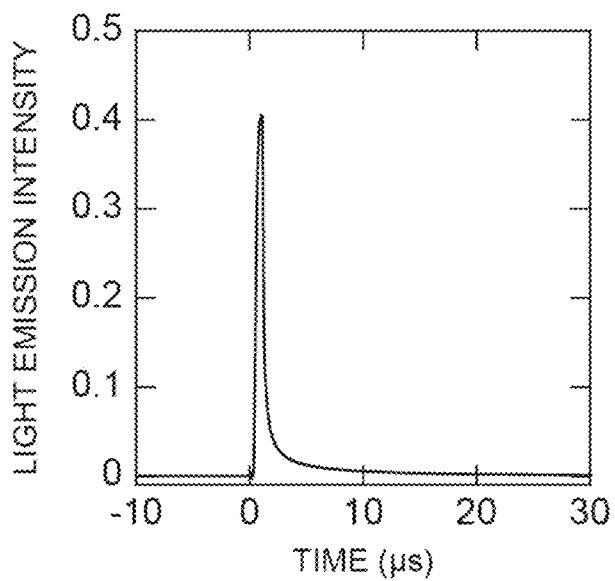
Figure 11A:
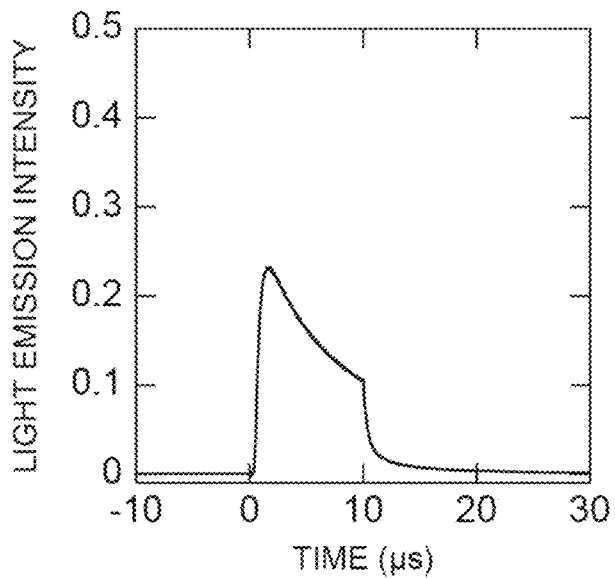
FIG. 11A and FIG. 11B are graphs showing experimental results.
Figure 11B:
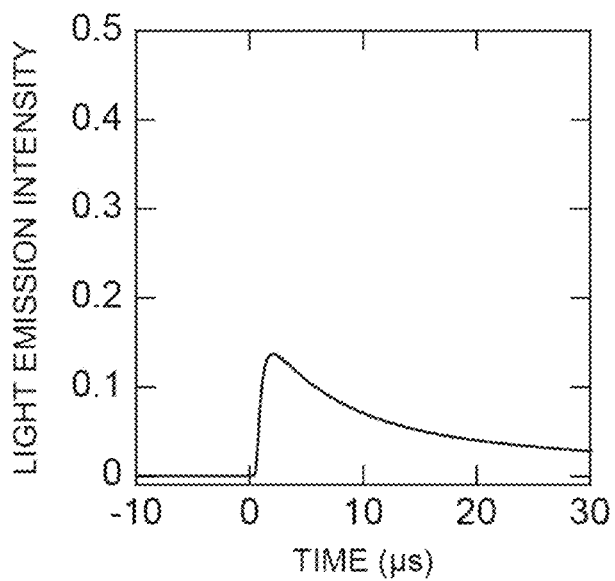

FIG. 10A is a graph showing a temporal variation of the light emission intensity in a case where the second period for which the forward voltage is applied is set to 0.5 µs. FIG. 10B is a graph showing a temporal variation of the light emission intensity in a case where the second period for which the forward voltage is applied is set to 1 µs. FIG. 11A is a graph showing a temporal variation of the light emission intensity in a case where the second period for which the forward voltage is applied is set to 10 µs. FIG. 11B is a graph showing a temporal variation of the light emission intensity in a case where the second period for which the forward voltage is applied is set to 100 µs. In an experiment shown in FIG. 10A to FIG. 11B, excitation light is incident to the organic light-emitting layer 23 while applying a predetermined reverse voltage in a predetermined first period, the predetermined reverse voltage is maintained in a predetermined delay period, and a predetermined forward voltage is applied in the second period from 0 µs. From the experimental results shown in FIG. 10A to FIG. 11B, it could be seen that the shorter the second period (pulse width) for which the forward voltage is applied, the further the peak intensity increases. However, when the pulse width is shorter than a time constant (RC time constant) of the organic light-emitting layer 23, there is a concern that response cannot be performed. Here, it is preferable that the second period (pulse width) for which the forward voltage is applied is a period of 100 ns to 100 µs.

Figure 12A:
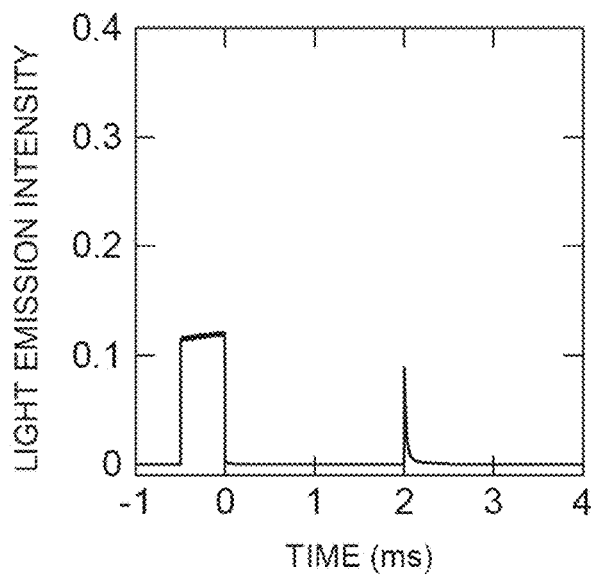
FIG. 12A, FIG. 12B, and FIG. 12C are graphs showing experimental results.
Figure 12B:
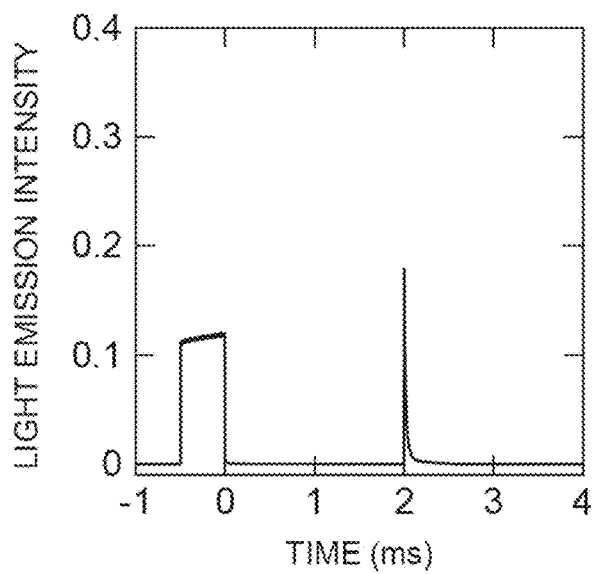
Figure 12C:
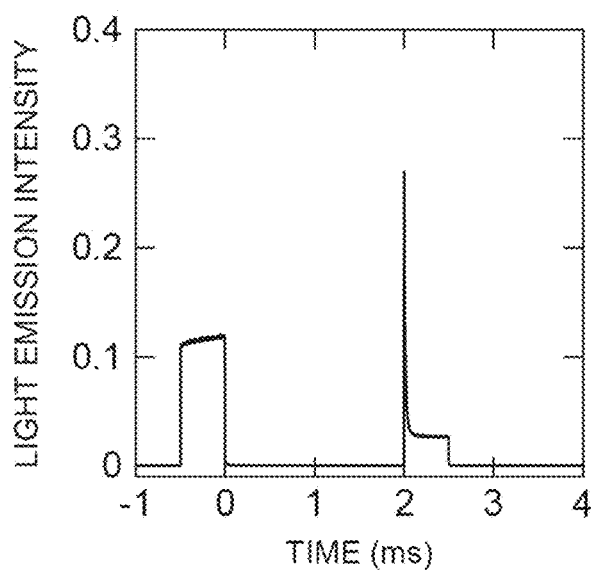

FIG. 12A is a graph showing a temporal variation of the light emission intensity in a case where a potential difference in the second period is set to 0. FIG. 12B is a graph showing a temporal variation of the light emission intensity in a case where the forward voltage that is applied in the second period is set to 2 V. FIG. 12C is a graph showing a temporal variation of the light emission intensity in a case where the forward voltage that is applied in the second period is set to 3 V. In an experiment shown in FIG. 12A to FIG. 12C, excitation light is incident to the organic light-emitting layer 23 while applying a reverse voltage of −6 V in a first period of −0.5 to 0 ms, application of the reverse voltage of −6 V is maintained in a delay period of 0 to 2 ms, and a potential difference is set to 0 or each forward voltage is applied in the second period of 2 to 2.5 ms.

Figure 13A:
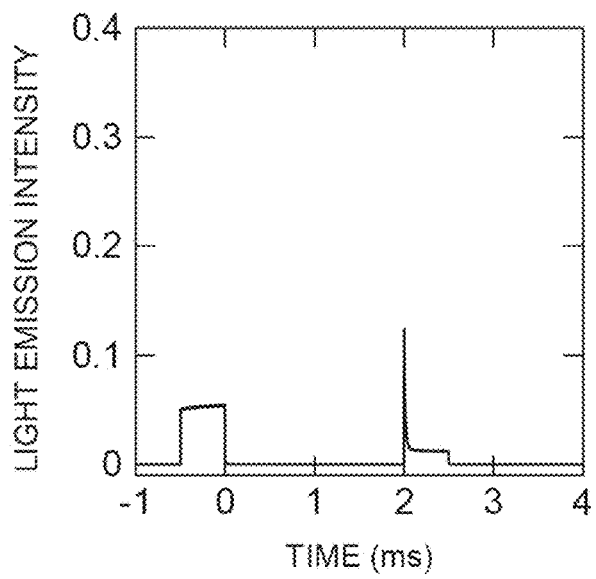
FIG. 13A, FIG. 13B, and FIG. 13C are graphs showing experimental results.
Figure 13B:
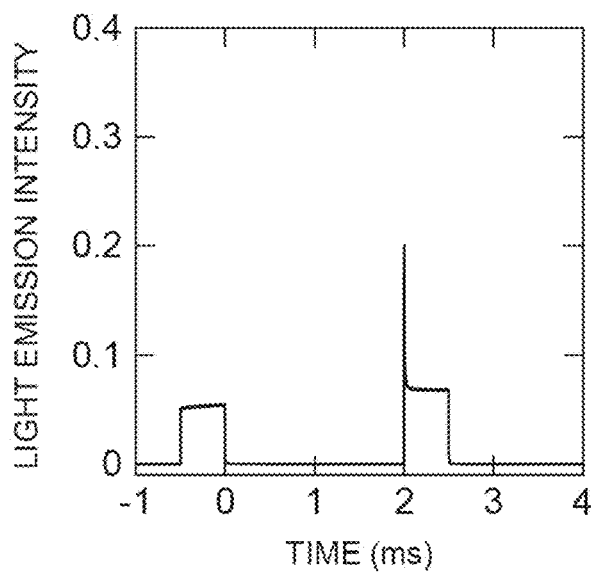
Figure 13C:
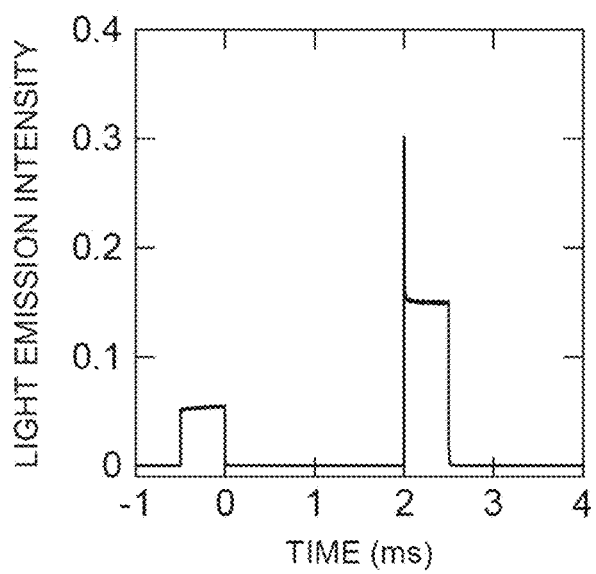

FIG. 13A is a graph showing a temporal variation of the light emission intensity in a case where a forward voltage that is applied in the second period is set to 3 V. FIG. 13B is a graph showing a temporal variation of the light emission intensity in a case where the forward voltage that is applied in the second period is set to 4 V. FIG. 13C is a graph showing a temporal variation of the light emission intensity in a case where the forward voltage that is applied in the second period is set to 5 V. In an experiment shown in FIG. 13A to FIG. 13C, excitation light is incident to the organic light-emitting layer 23 while applying a reverse voltage of −6 V in the first period of −0.5 to 0 ms, application of the reverse voltage of −6 V is maintained in a delay period of 0 to 2 ms, and each forward voltage is applied in the second period of 2 to 2.5 ms.

From the experimental results shown in FIG. 12A to FIG. 13C, it could be seen that when increasing the forward voltage applied in the second period, a displacement current increases, and thus the peak intensity also increases in accordance with the increase in the displacement current. A threshold value (current injection initiation) voltage at the time of CW operation of the organic light-emitting element 2 having a base structure is 2 V or greater, but it could be seen that when excitation light is incident to the organic light-emitting layer 23 in the first period and separation of charges is caused to occur, even at a voltage less than 2 V, current injection is initiated, and light emission is observed.

Figure 14A:
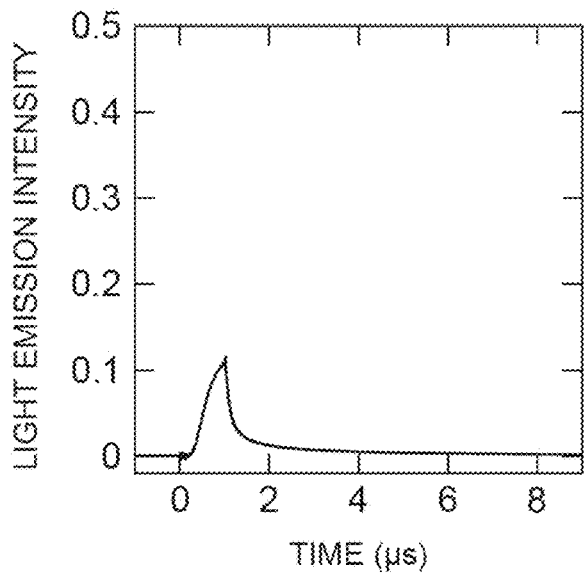
FIG. 14A, FIG. 14B, and FIG. 14C are graphs showing experimental results.
Figure 14B:
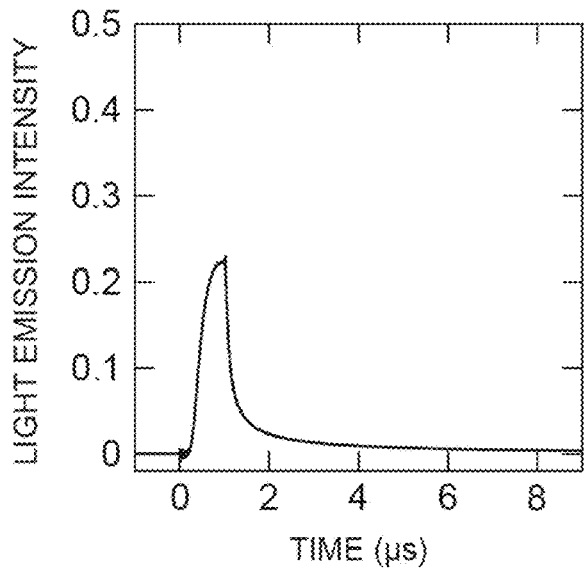
Figure 14C:
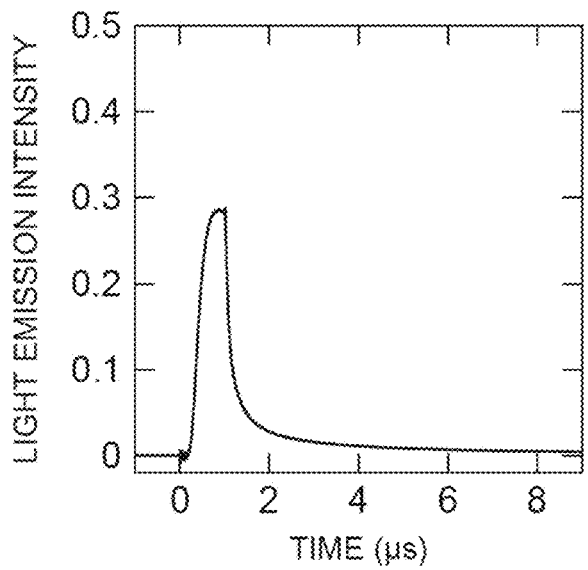
Figure 15A:
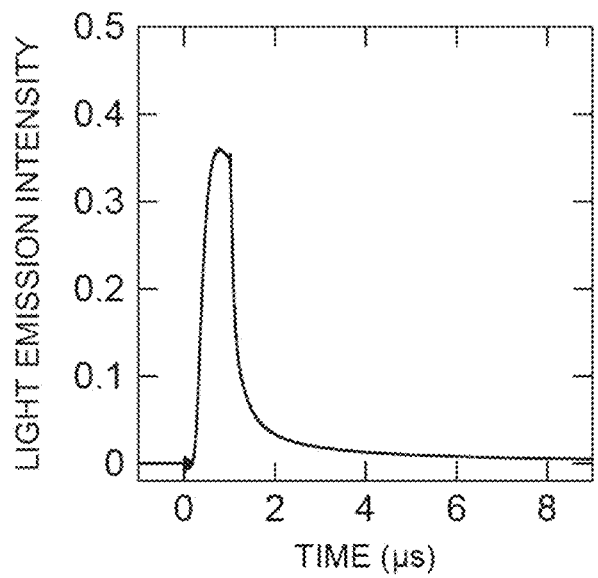
FIG. 15A and FIG. 15B are graphs showing experimental results.
Figure 15B:
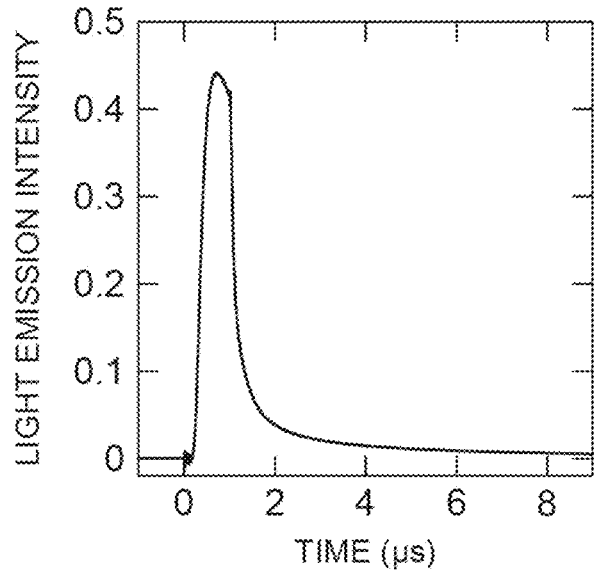

FIG. 14A is a graph showing a temporal variation of the light emission intensity in a case where a potential difference in the second period is set to 0. FIG. 14B is a graph showing a temporal variation of the light emission intensity in a case where a forward voltage that is applied in the second period is set to 2 V. FIG. 14C is a graph showing a temporal variation of the light emission intensity in a case where the forward voltage that is applied in the second period is set to 3 V. FIG. 15A is a graph showing a temporal variation of the light emission intensity in a case where the forward voltage that is applied in the second period is set to 4 V. FIG. 15B is a graph showing a temporal variation of the light emission intensity in a case where the forward voltage that is applied in the second period is set to 5 V. In an experiment shown in FIG. 14A to FIG. 15B, excitation light is incident to the organic light-emitting layer 23 while applying the reverse voltage of −6 V in a predetermined first period, application of the reverse voltage of −6 V is maintained in a predetermined delay period, and a potential difference is set to 0 or each forward voltage is applied in a predetermined second period from 0 μs. A response speed in a case shown in FIG. 14A was 506 ns. A response speed in a case shown in FIG. 14B was 379 ns. A response speed in a case shown in FIG. 14C was 329 ns. A response speed in a case shown in FIG. 15A was 289 ns. A response speed in a case shown in FIG. 15B was 266 ns. From the experimental results shown in FIG. 14A to FIG. 15B, it could be seen that when increasing the forward voltage that is applied in the second period, a displacement current increases, and thus the response speed also increases in accordance with the increase in the displacement current.

Figure 16A:
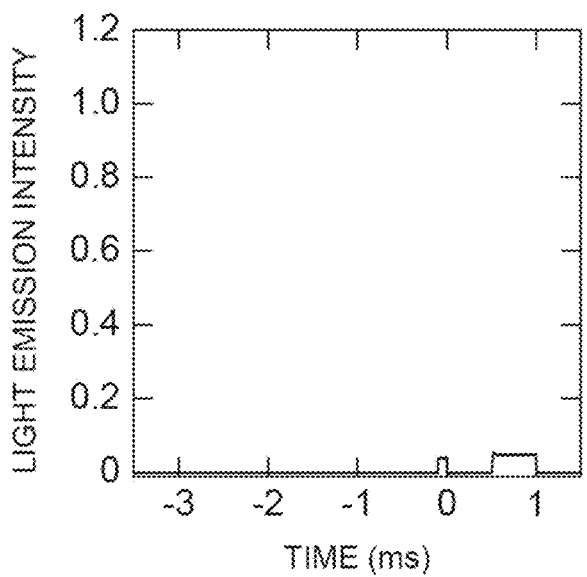
FIG. 16A, FIG. 16B, and FIG. 16C are graphs showing experimental results.
Figure 16B:
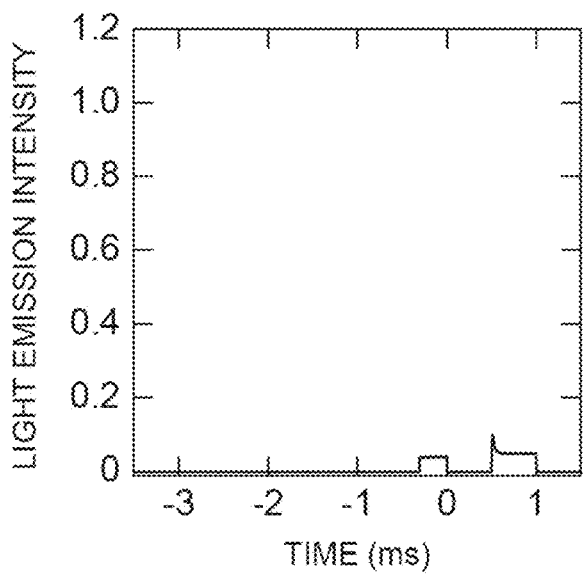
Figure 16C:
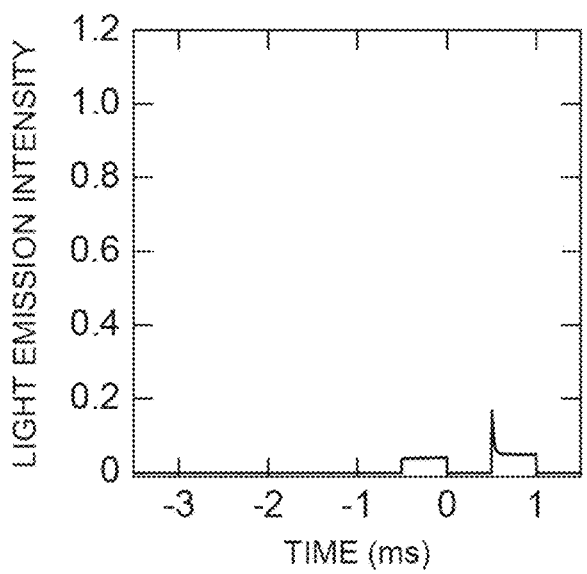
Figure 17A:
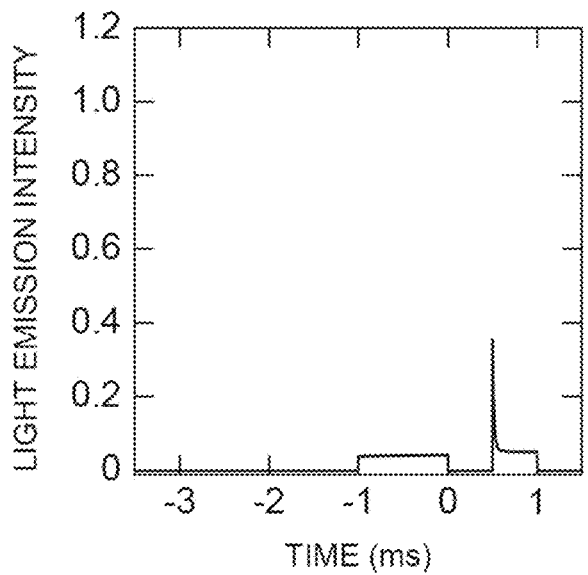
FIG. 17A, FIG. 17B, and FIG. 17C are graphs showing experimental results.
Figure 17B:
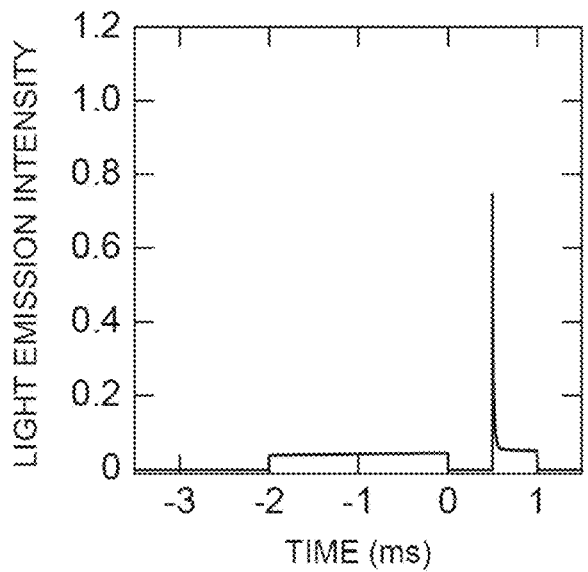
Figure 17C:
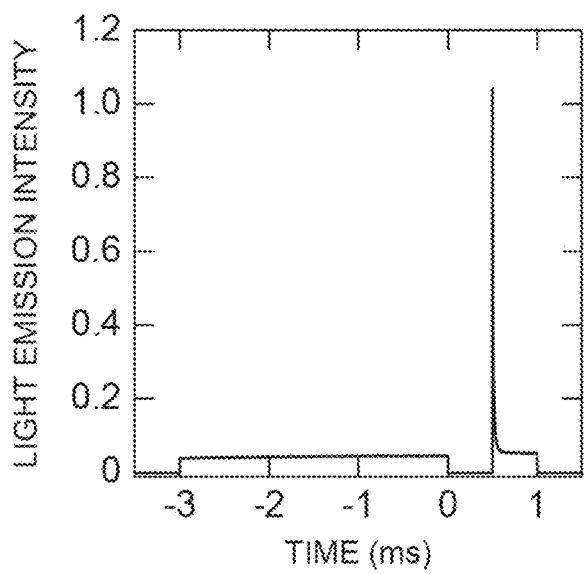

FIG. 16A is a graph showing a temporal variation of the light emission intensity in a case where the first period for which excitation light is incident to the organic light-emitting layer 23 is set to 100 μs. FIG. 16B is a graph showing a temporal variation of the light emission intensity in a case where the first period for which excitation light is incident to the organic light-emitting layer 23 is set to 300 μs. FIG. 16C is a graph showing a temporal variation of the light emission intensity in a case where the first period for which excitation light is incident to the organic light-emitting layer 23 is set to 500 μs. FIG. 17A is a graph showing a temporal variation of the light emission intensity in a case where the first period for which excitation light is incident to the organic light-emitting layer 23 is set to 1 ms. FIG. 17B is a graph showing a temporal variation of the light emission intensity in a case where the first period for which excitation light is incident to the organic light-emitting layer 23 is set to 2 ms. FIG. 17C is a graph showing a temporal variation of the light emission intensity in a case where the first period for which excitation light is incident to the organic light-emitting layer 23 is set to 3 ms. In an experiment shown in FIG. 16A to FIG. 17C, excitation light is incident to the organic light-emitting layer 23 while applying a reverse voltage of −6 V in each first period, application of the reverse voltage of −6 V is maintained in a delay period of 0 to 0.5 ms, and a forward voltage of +3 V is applied in the second period of 0.5 to 1 ms. From the experimental results shown in FIG. 16A to FIG. 17C, it could be seen that when extending the first period for which excitation light is incident to the organic light-emitting layer 23, a total light quantity of the excitation light incident to the organic light-emitting layer 23 increases, and the amount of electrons accumulated in the organic light-emitting layer 23 increases, and thus the peak intensity also increases in accordance with the increase in the amount of electrons.

Figure 18A:
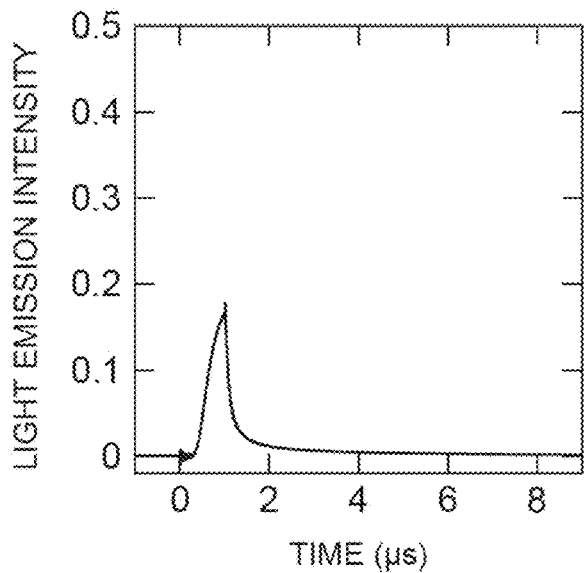
FIG. 18A, FIG. 18B, and FIG. 18C are graphs showing experimental results.
Figure 18B:
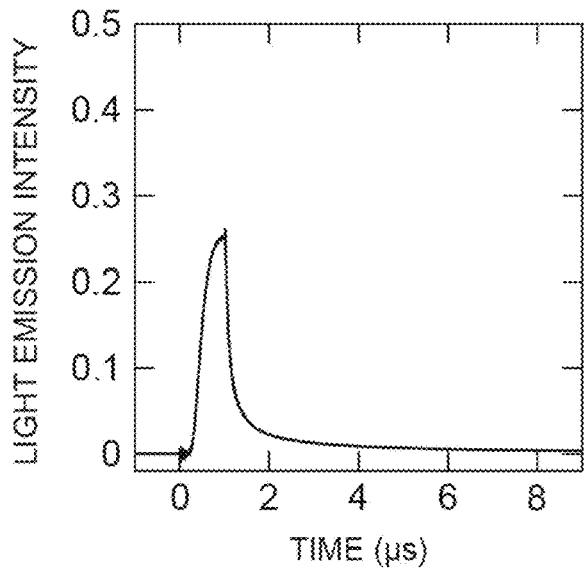
Figure 18C:
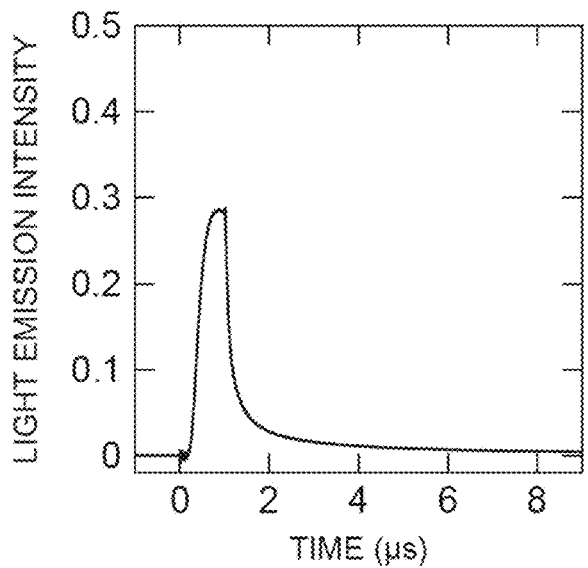
Figure 19A:
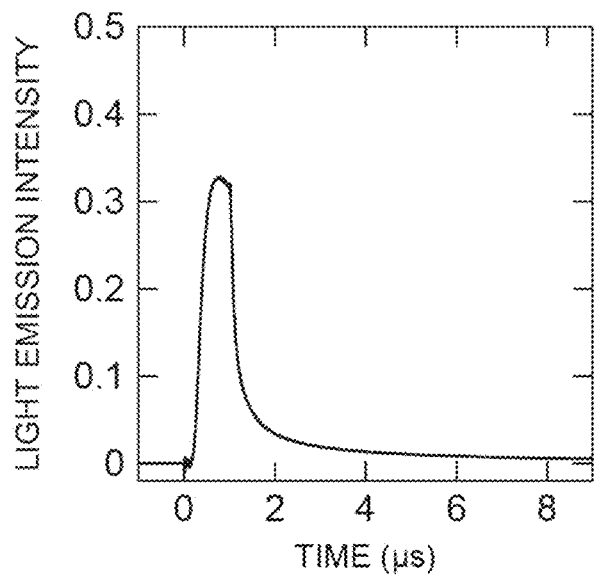
FIG. 19A and FIG. 19B are graphs showing experimental results.
Figure 19B:
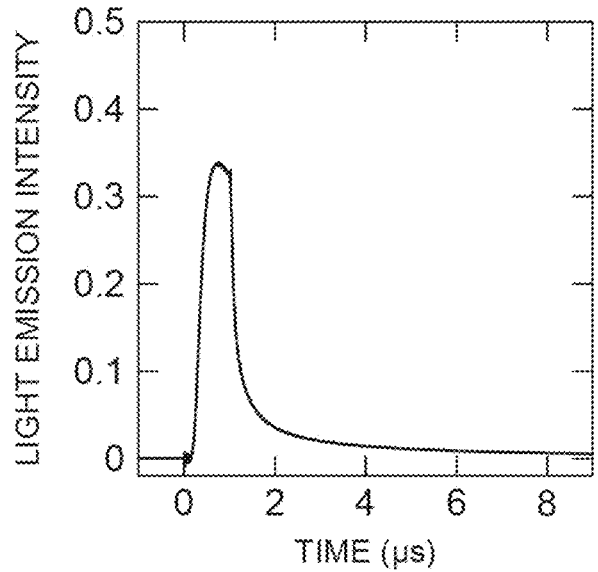

FIG. 18A is a graph showing a temporal variation of the light emission intensity in a case where the first period for which excitation light is incident to the organic light-emitting layer 23 is set to 100 μs. FIG. 18B is a graph showing a temporal variation of the light emission intensity in a case where the first period for which excitation light is incident to the organic light-emitting layer 23 is set to 300 μs. FIG. 18C is a graph showing a temporal variation of the light emission intensity in a case where the first period for which excitation light is incident to the organic light-emitting layer 23 is set to 500 μs. FIG. 19A is graph showing a temporal variation of the light emission intensity in a case where the first period for which excitation light is incident to the organic light-emitting layer 23 is set to 1 ms. FIG. 19B is a graph showing a temporal variation of the light emission intensity in a case where the first period for which excitation light is incident to the organic light-emitting layer 23 is set to 2 ms. In an experiment shown in FIG. 18A to FIG. 19B, excitation light is incident to the organic light-emitting layer 23 while applying a reverse voltage of −6 V in each first period, application of the reverse voltage of −6 V is maintained in a predetermined delay period, and a forward voltage of +3 V is applied in a predetermined second period from 0 μs. A response speed in a case shown in FIG. 18A was 444 ns. A response speed in a case shown in FIG. 18B was 377 ns. A response speed in a case shown in FIG. 18C was 334 ns. A response speed in a case shown in FIG. 19A was 298 ns. A response speed in a case shown in FIG. 19B was 286 ns. From the experimental results shown in FIG. 18A to FIG. 19B, it could be seen that when extending the first period for which excitation light is incident to the organic light-emitting layer 23, a total light quantity of the excitation light incident to the organic light-emitting layer 23 increases, and the amount of electrons accumulated in the organic light-emitting layer 23 increases, and thus the response speed also increases in accordance with the increase in the amount of electrons.

Figure 20A:
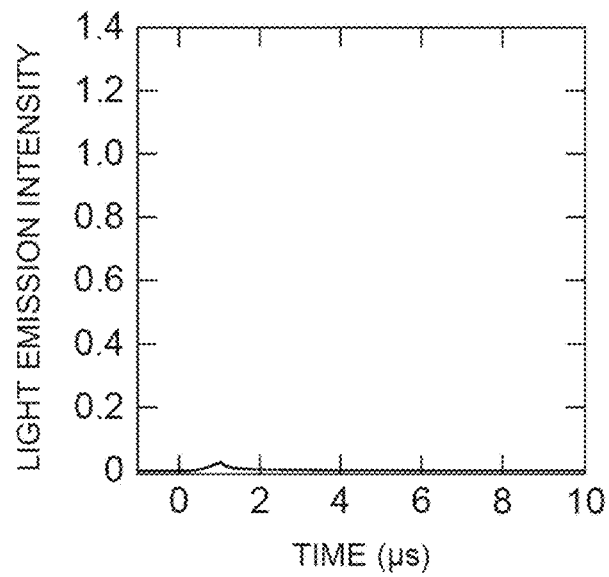
FIG. 20A, FIG. 20B, and FIG. 20C are graphs showing experimental results.
Figure 20B:
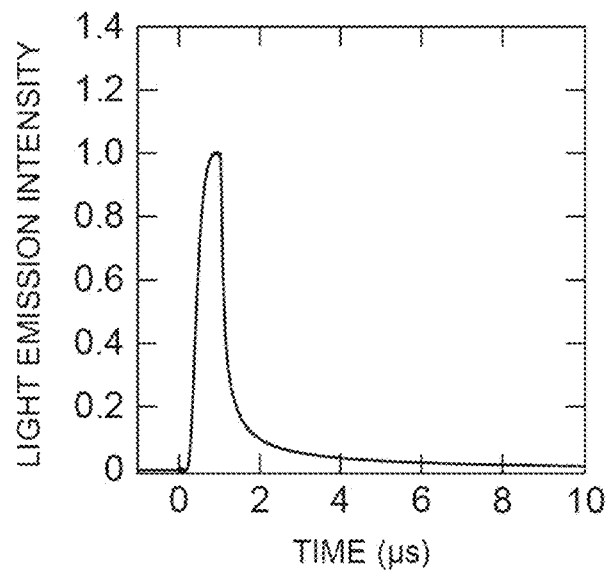
Figure 20C:
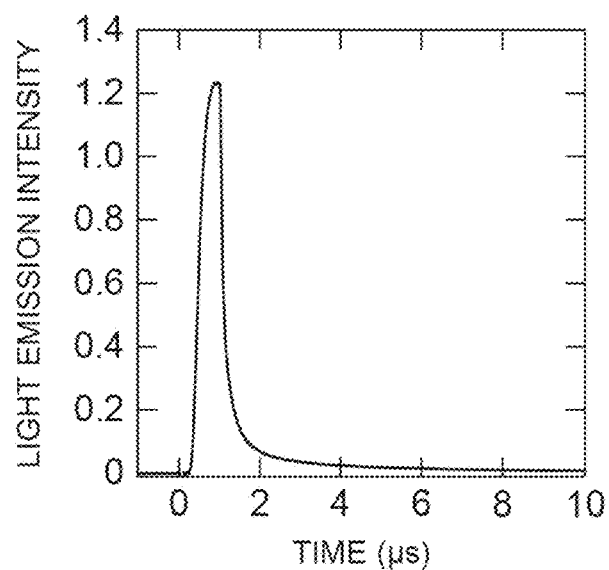

FIG. 20A is a graph showing a temporal variation of the light emission intensity in a case where a potential difference in the first period and the delay period is set to 0. FIG. 20B is a graph showing a temporal variation of the light emission intensity in a case where a reverse voltage that is applied in the first period and the delay period is set to −6 V. FIG. 20B is a graph showing a temporal variation of the light emission intensity in a case where the reverse voltage that is applied in the first period and the delay period is set to −10 V. In an experiment shown in FIG. 20A and FIG. 20B, excitation light is incident to the organic light-emitting layer 23 while setting the potential difference to 0 or applying each reverse voltage in a predetermined first period, a potential difference in a predetermined delay period is maintained to 0 or application of each reverse voltage is maintained, and a forward voltage of +3 V is applied in a predetermined second period from 0 μs. From the experimental results shown in FIG. 20A and FIG. 20B, it could be seen that when increasing the reverse voltage that is applied in the first period for which the excitation light is incident to the organic light-emitting layer 23, separation of charges is promoted and the amount of electrons accumulated in the organic light-emitting layer 23 also increases, and thus the peak intensity also increases and the response speed also increases in accordance with the increase in the amount of electrons.

Figure 21A:
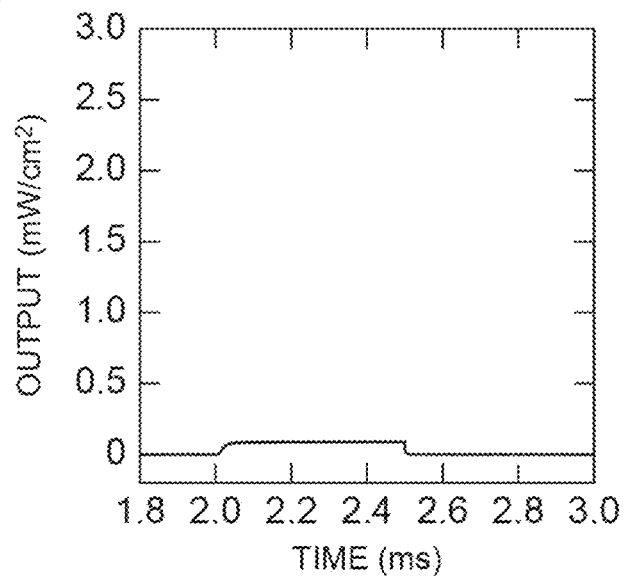
FIG. 21A and FIG. 21B are graphs showing experimental results.
Figure 21B:
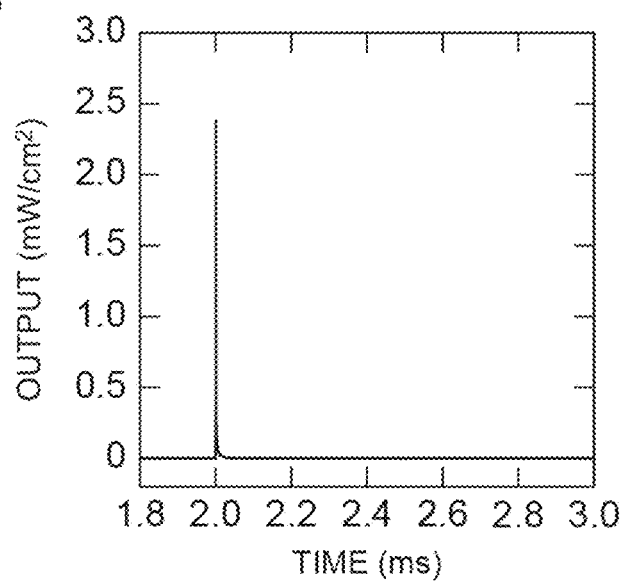

FIG. 21A is a graph showing a temporal variation of the light emission intensity (output) "in a case where excitation light is not incident to the organic light-emitting layer 23 while applying a reverse voltage of −6 V in a period up to 2 ms, and a forward voltage of +3 V is applied in the second period of 2 to 2.8 ms". The peak intensity in this case was 0.09 mW/cm$^2$, and the response speed was 38.4 μs. FIG. 21B is a graph showing a temporal variation of the light emission intensity (output) "in a case where excitation light is incident to the organic light-emitting layer 23 while applying a reverse voltage of −6 V in a predetermined first period, application of the reverse voltage of −6 V is maintained in a predetermined delay period, and a forward voltage of +3 V is applied in the second period of 2 to 2.001 ms". The peak intensity in this case was 2.39 mW/cm$^2$, and the response speed was 330 ns. As described above, in the case shown in FIG. 21B, the obtained peak intensity was 27 times the peak intensity in the case shown in FIG. 21B, and the obtained response speed was $\frac{1}{100}$ times the response speed in the case shown in FIG. 21A.

Figure 22:
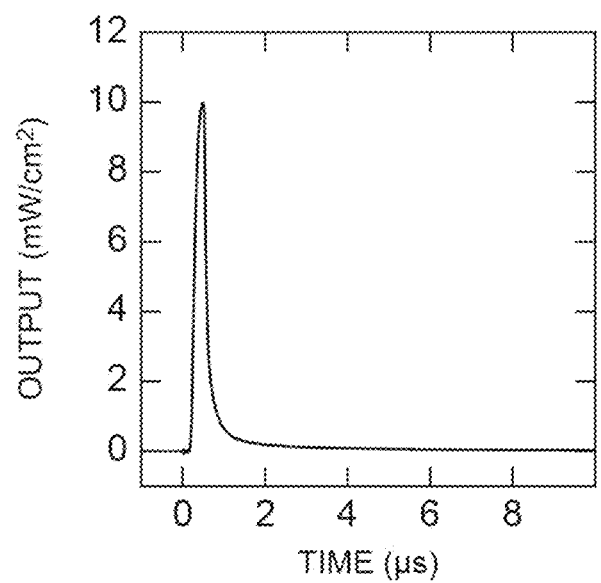
FIG. 22 is a graph showing experimental results.

FIG. 22 is a graph showing a temporal variation of the light emission intensity (output) "in a case where excitation light is incident to the organic light-emitting layer 23 while applying a reverse voltage of −10 V in a predetermined first period, application of the reverse voltage of −10 V is maintained in a predetermined delay period, and a forward voltage of +10 V is applied in the second period of 0 to 0.5 μs". The peak intensity in this case was 10.0 mW/cm², and the response speed was 165 ns. As described above, in the case shown in FIG. 22, the obtained peak intensity was 100 times the peak intensity in the case shown in FIG. 21B, and the obtained response speed was 1/200 times the response speed in the case shown in FIG. 21A.

Figure 23A:
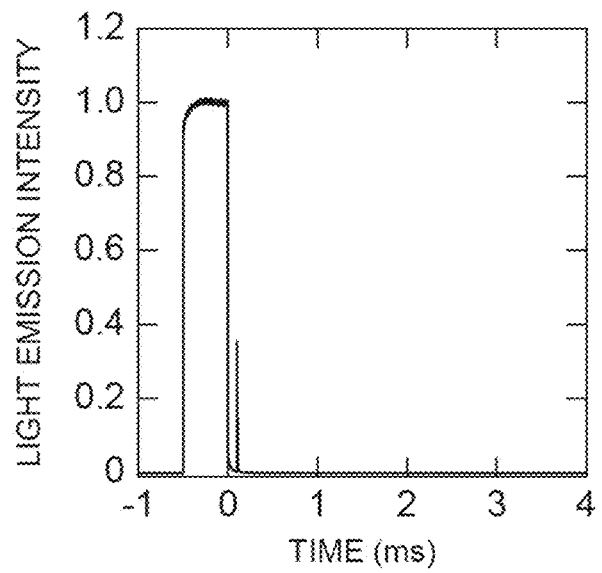
FIG. 23A, FIG. 23B, and FIG. 23C are graphs showing experimental results.
Figure 23B:
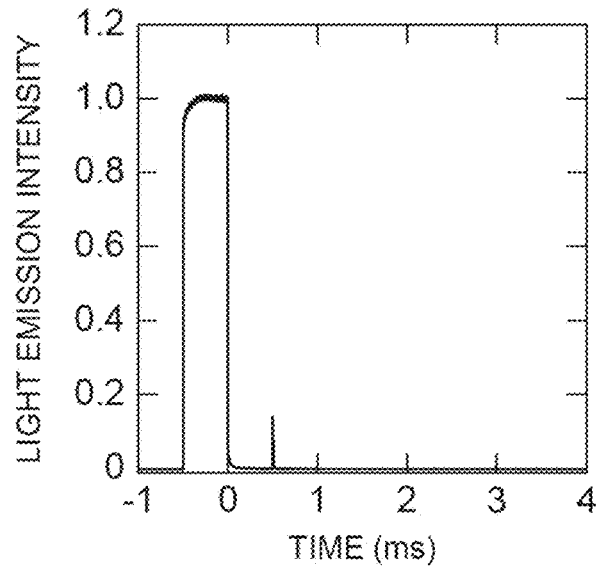
Figure 23C:
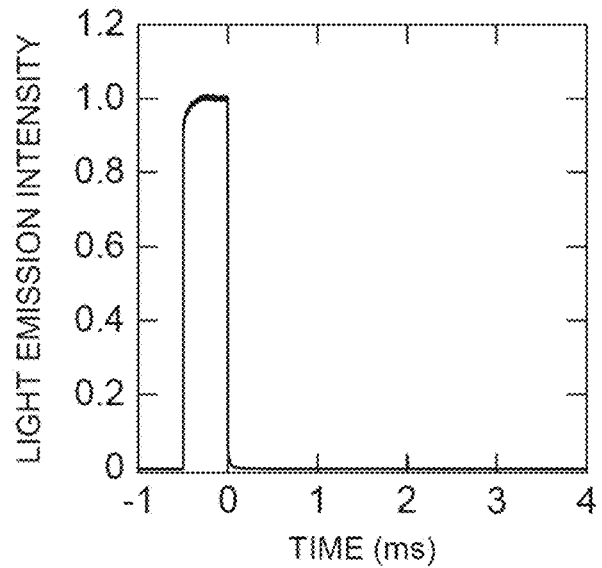

FIG. 23A to FIG. 23C are graphs showing a temporal variation of the light emission intensity in a case of using an organic light-emitting element having a comparative structure. The organic light-emitting element having the comparative structure is mainly different from the organic light-emitting element 2 having a base structure in that the hole transporting layer 24 is not provided. FIG. 23A is a graph showing a temporal variation of the light emission intensity in a case where the delay period is set to 0.1 ms. FIG. 23B is a graph showing a temporal variation of the light emission intensity in a case where the delay period is set to 0.5 ms. FIG. 23C is a graph showing a temporal variation of the light emission intensity in a case where the delay period is set to 2 ms. In an experiment shown in FIG. 23A to FIG. 23C, excitation light is incident to the organic light-emitting layer 23 while applying a predetermined reverse voltage in a predetermined first period, application of the predetermined reverse voltage is maintained in each delay period, and a predetermined forward voltage is applied in a predetermined second period. As described above, in a case of using the organic light-emitting element having the comparative structure, when lengthening the delay period, the peak intensity greatly attenuated. The reason for this is considered as follows. When the organic light-emitting layer 23 is in contact with the first electrode 21, polarization of the organic light emitters is weakened, and accumulated electrons are likely to be lost.

Figure 24A:
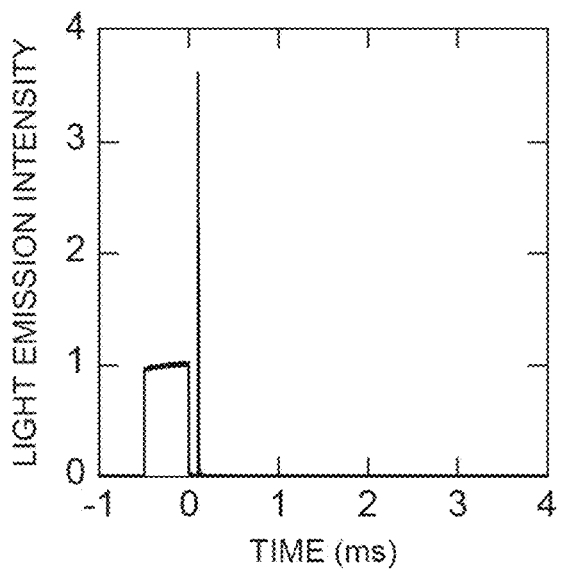
FIG. 24A, FIG. 24B, and FIG. 24C are graphs showing experimental results.
Figure 24B:
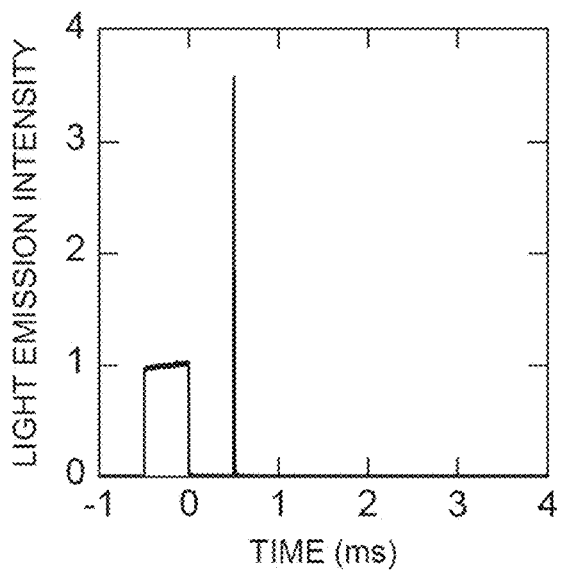
Figure 24C:
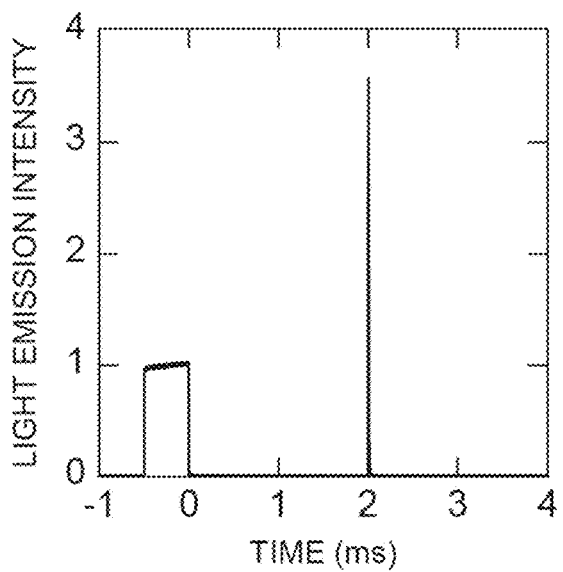

FIG. 24A to FIG. 24C are graphs showing a temporal variation of the light emission intensity in a case of using the organic light-emitting element 2 having a base structure. FIG. 24A is a graph showing a temporal variation of the light emission intensity in a case where the delay period is set to 0.1 ms. FIG. 24B is a graph showing a temporal variation of the light emission intensity in a case where the delay period is set to 0.5 ms. FIG. 24C is a graph showing a temporal variation of the light emission intensity in a case where the delay period is set to 2 ms. In an experiment shown in FIG. 24A to FIG. 24C, excitation light is incident to the organic light-emitting layer 23 while applying a predetermined reverse voltage in a predetermined first period, application of the predetermined reverse voltage is maintained in each delay period, and a predetermined forward voltage is applied in a predetermined second period. As described above, in a case of using the organic light-emitting element 2 having a base structure, even when lengthening the delay period, the peak intensity hardly attenuated. The reason for this is considered as follows. When the hole transporting layer 24 is disposed between the first electrode 21 and the organic light-emitting layer 23, polarization of the organic light emitters becomes strong, and accumulated electrons are less likely to be lost.

Figure 25A:
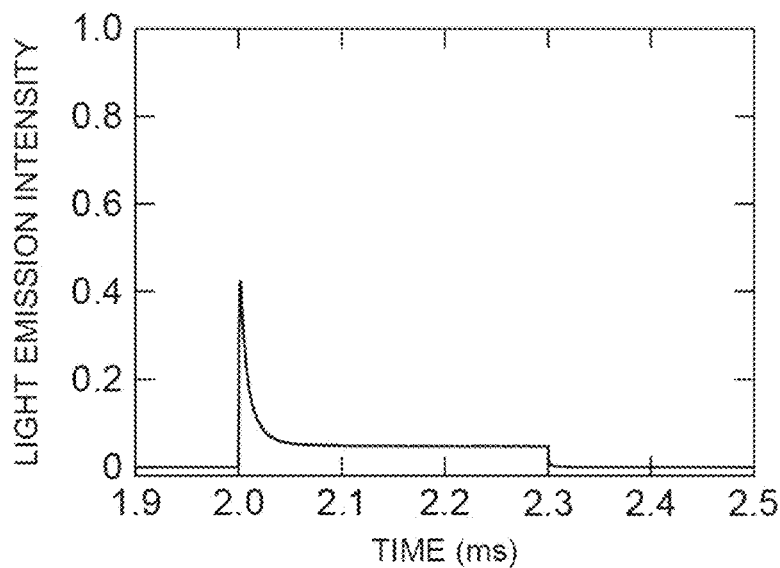
FIG. 25A, FIG. 25B, and FIG. 25C are graphs showing experimental results.
Figure 25B:
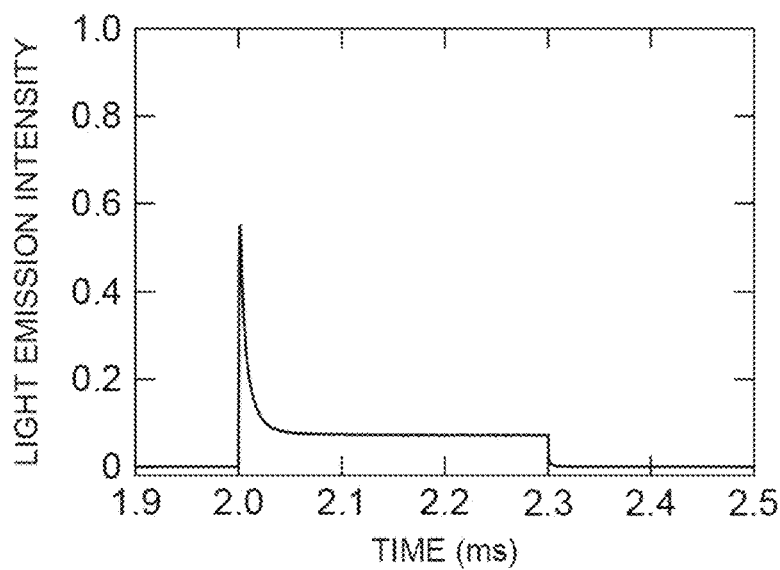
Figure 25C:
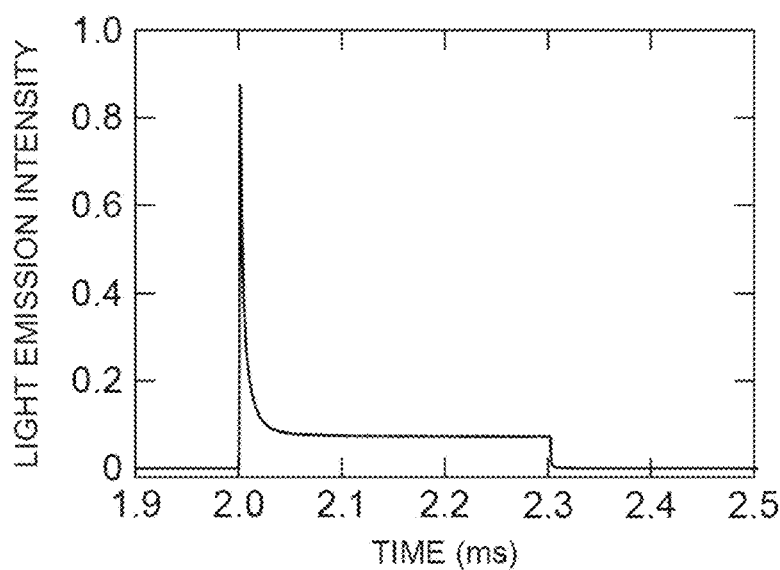

FIG. 25A is a graph showing a temporal variation of the light emission intensity in a case where the thickness of the hole transporting layer 24 in the organic light-emitting element 2 having a base structure is set to 80 nm. FIG. 25B is a graph showing a temporal variation of the light emission intensity in a case where the thickness of the hole transporting layer 24 in the organic light-emitting element 2 having a base structure is set to 50 nm. FIG. 25C is a graph showing a temporal variation of the light emission intensity in a case where the thickness of the hole transporting layer 24 in the organic light-emitting element 2 having a base structure is set to 20 nm. In an experiment shown in FIG. 25A to FIG. 25C, excitation light is incident to the organic light-emitting layer 23 while applying a predetermined reverse voltage in a predetermined first period, application of the predetermined reverse voltage is maintained in a predetermined delay period, and a predetermined forward voltage is applied in a predetermined second period. From the experimental results shown in FIG. 25A to FIG. 25C, it could be seen that when increasing the thickness of the hole transporting layer 24, the peak intensity and the response speed tend to decrease.

Figure 26:
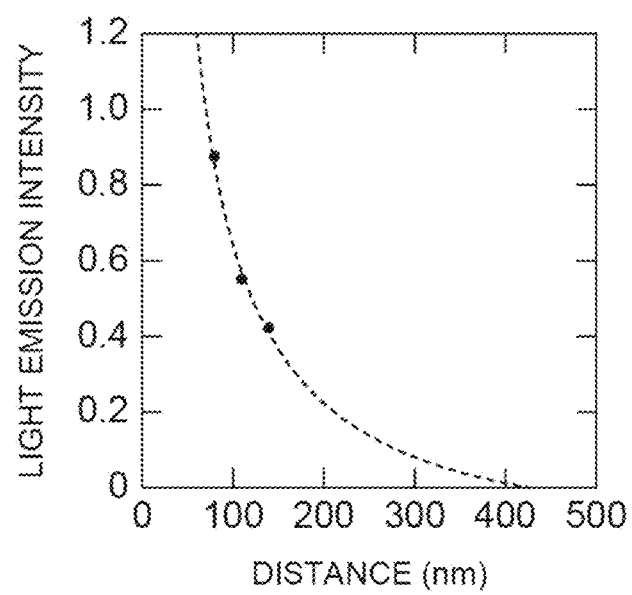
FIG. 26 is a graph showing experimental results.

FIG. 26 is a graph showing a "relationship between a distance between the first electrode 21 and the charge block layer 25, and the light emission intensity" created on the basis of the experimental results shown in FIG. 25A to FIG. 25C. From the graph shown in FIG. 26, it could be seen that it is important to set the thickness of the hole transporting layer 24 so that the distance between the first electrode 21 and the charge block layer 25 becomes 400 nm or less in order to sufficiently accumulate electrons generated due to separation of charges in the organic light-emitting layer 23 while exhibiting the effect of the hole transporting layer 24.

From the above-described experimental results, it could be seen that each of extension of the first period for which excitation light is incident to the organic light-emitting layer 23, an increase in the intensity of excitation light incident to the organic light-emitting layer 23, an increase in the reverse voltage that is applied in the first period and the delay period, shortening of the second period for which the forward voltage is applied, and an increase in the forward voltage that is applied in the second period tends to lead to an increase in the peak intensity and an increase in the response speed. Accordingly, it is preferable that the controller 3 can arbitrarily adjust a duration of the first period for which excitation light is incident to the organic light-emitting layer 23, a value of the intensity of excitation light incident to the organic light-emitting layer 23, the first period, a value of the reverse voltage that is applied in the delay period, a duration of the second period for which the forward voltage is applied, and a value of the forward voltage that is applied in the second period (that is, by selecting an arbitrary one or by selecting arbitrary two or more).

Note that, even in a case where the delay time is longer than the delay time in the experimental results, light emission with a high peak intensity and a high response speed can be obtained. As an example, even in a case where excitation light is incident to the organic light-emitting layer 23 for 3 s while applying a reverse voltage of −2 V in a predetermined first period, and a forward voltage of +3 V is applied so that a pulse width becomes 10 μs after passage of a delay period of 10000 s, light emission with a sufficient peak intensity and a sufficient response speed could be obtained. As described above, even in a case where the delay period is long, charges can be retained for a long time and light emission can be obtained.

Description will be given of verification results relating to possibility of long time retention of charges. In the verification, an organic light-emitting element 2 shown in FIG. 35 was prepared. The organic light-emitting element 2 shown in FIG. 35 is different from the example of the organic light-emitting element 2 shown in FIG. 2 in that the buffer layer 27 is not provided, and the second electrode 22 is formed from Al.

Figure 35:
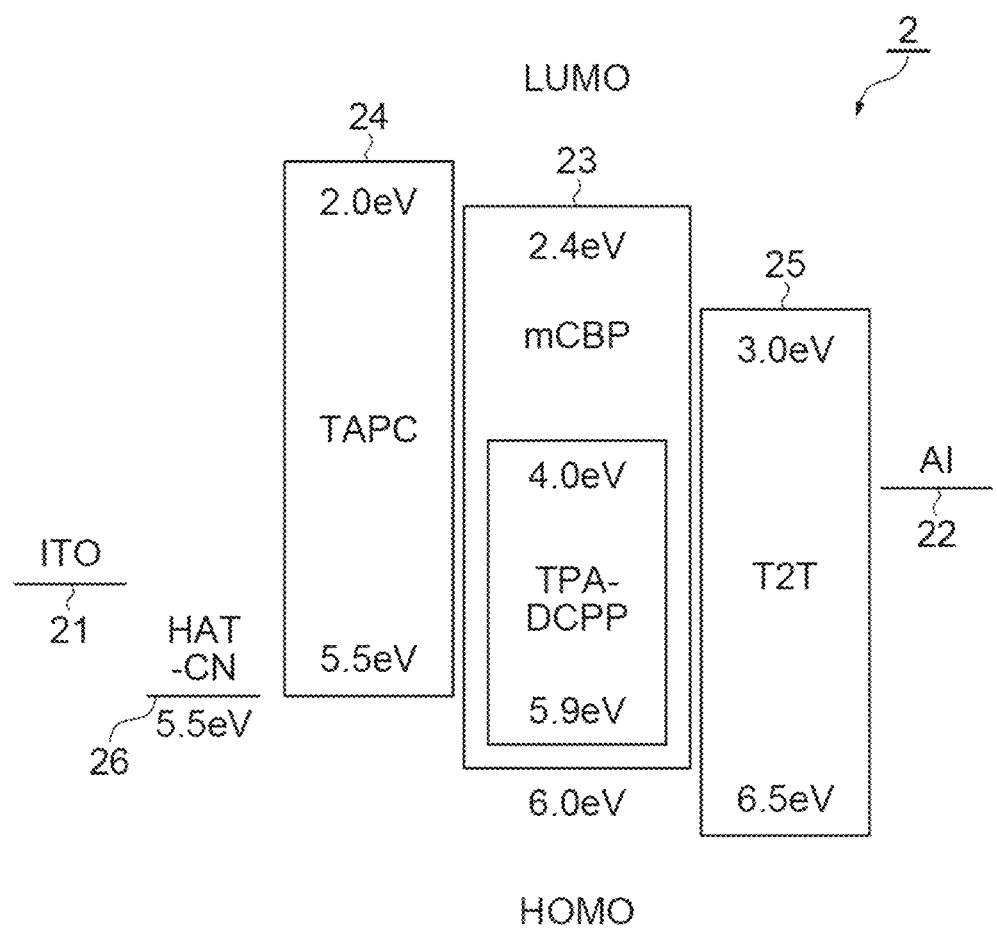
FIG. 35 is an energy diagram of an organic light-emitting element of a modification example.
Figure 36:
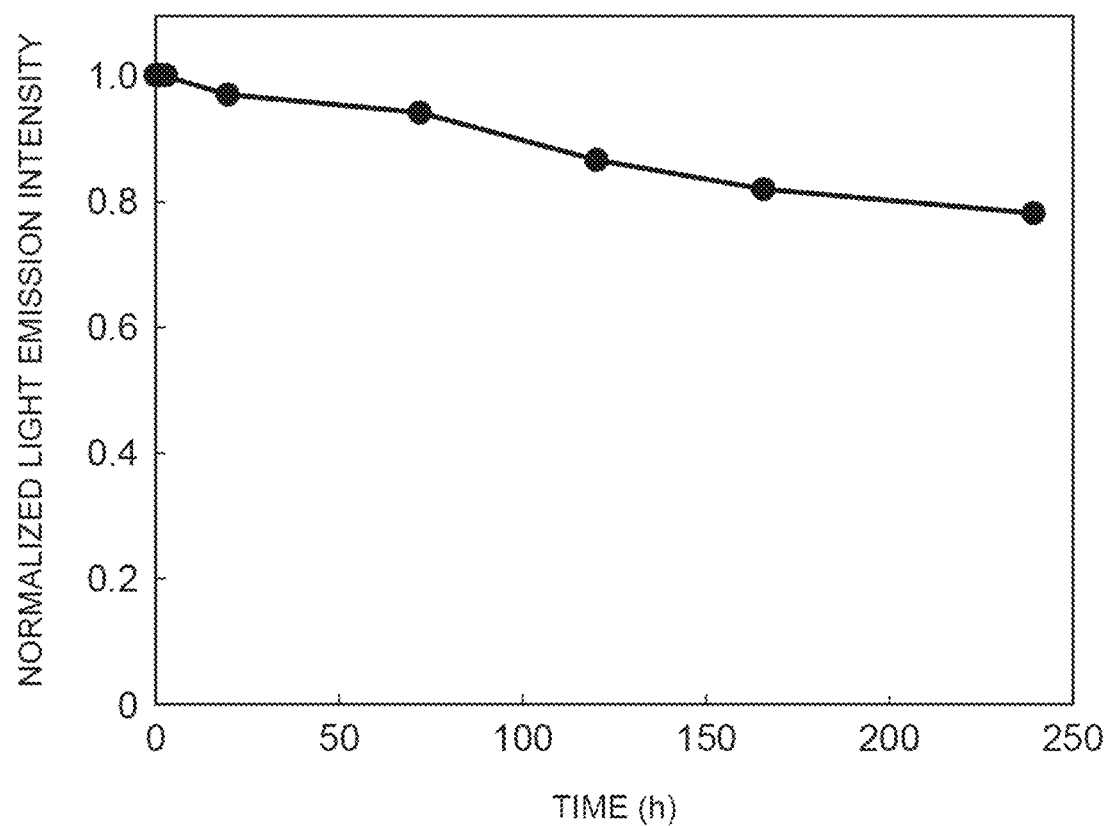
FIG. 36 is a graph showing experimental results.

First, with respect to the organic light-emitting element 2 shown in FIG. 35, after performing a process "in which excitation light is incident to the organic light-emitting layer 23 while applying a reverse voltage of −2 V in a predetermined first period, a state (open state) of being separated from a circuit is maintained in a predetermined delay period, a reverse voltage of −2 V is applied again, and a forward voltage of +10 V is applied in a second period of 0 to 10 μs", the peak intensity of light emission in the organic light-emitting layer 23 was measured. In the process, the delay period was caused to vary, and light emission intensity was measured with respect to respective delay times of 0.1 s, 10 s, 100 s, 1000 s, 10000 s, 20 h, 72 h, 120 h, 166 h, and 239 h. FIG. 36 is a graph showing "light emission intensity with respect to each delay time" when "integral value of light emission intensity with respect to a delay time of 0.1 s" is set to 1.0. When fitting results shown in FIG. 36 with "$f(t)=Ae^{-t/\tau}$", a time constant τ became 903 h, and it was implied that charges can be retained for one month or longer.

Figure 37:
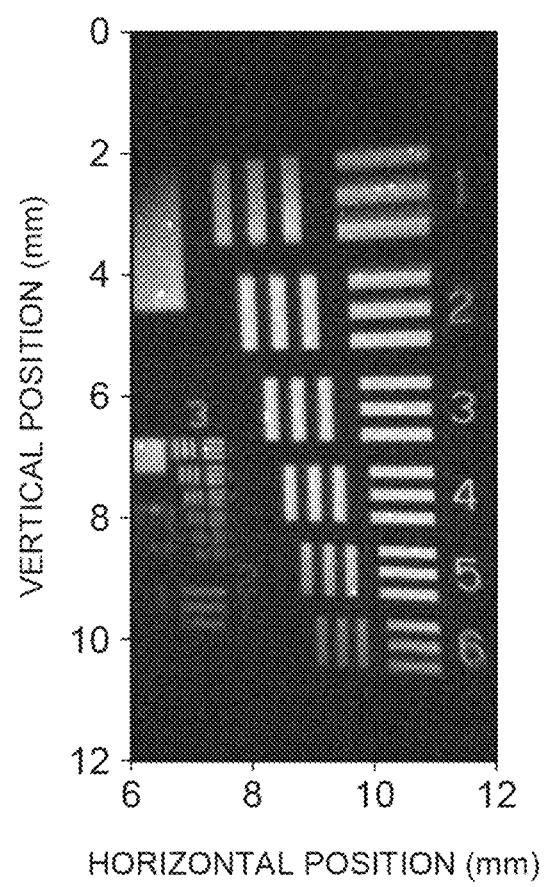
FIG. 37 is a photograph showing a light emission state of an organic light-emitting layer of an organic light-emitting element of a modification example.
Figure 38A:
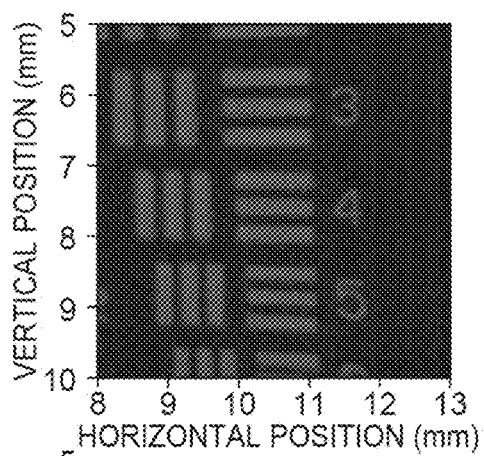
FIG. 38A, FIG. 38B, FIG. 38C, and FIG. 38D are photographs showing a light emission state of an organic light-emitting layer of an organic light-emitting element of a modification example.
Figure 38B:
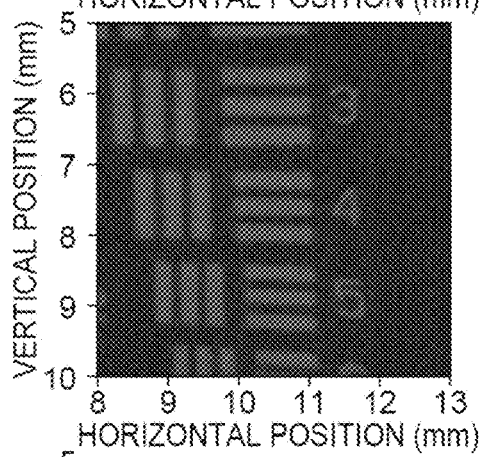
Figure 38C:
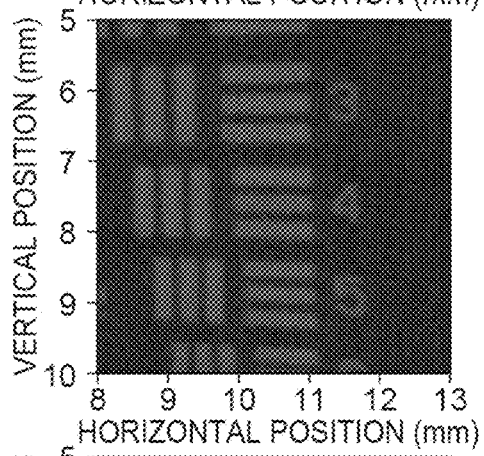
Figure 38D:
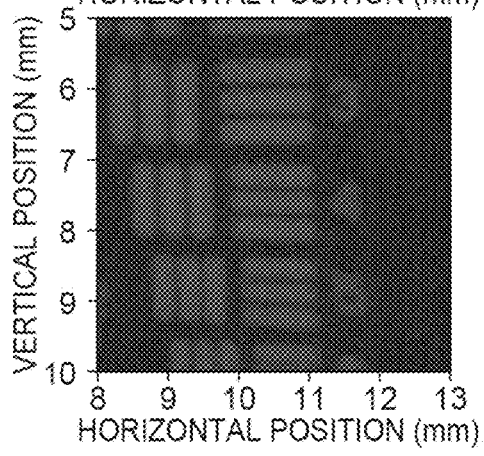
Figure 39:
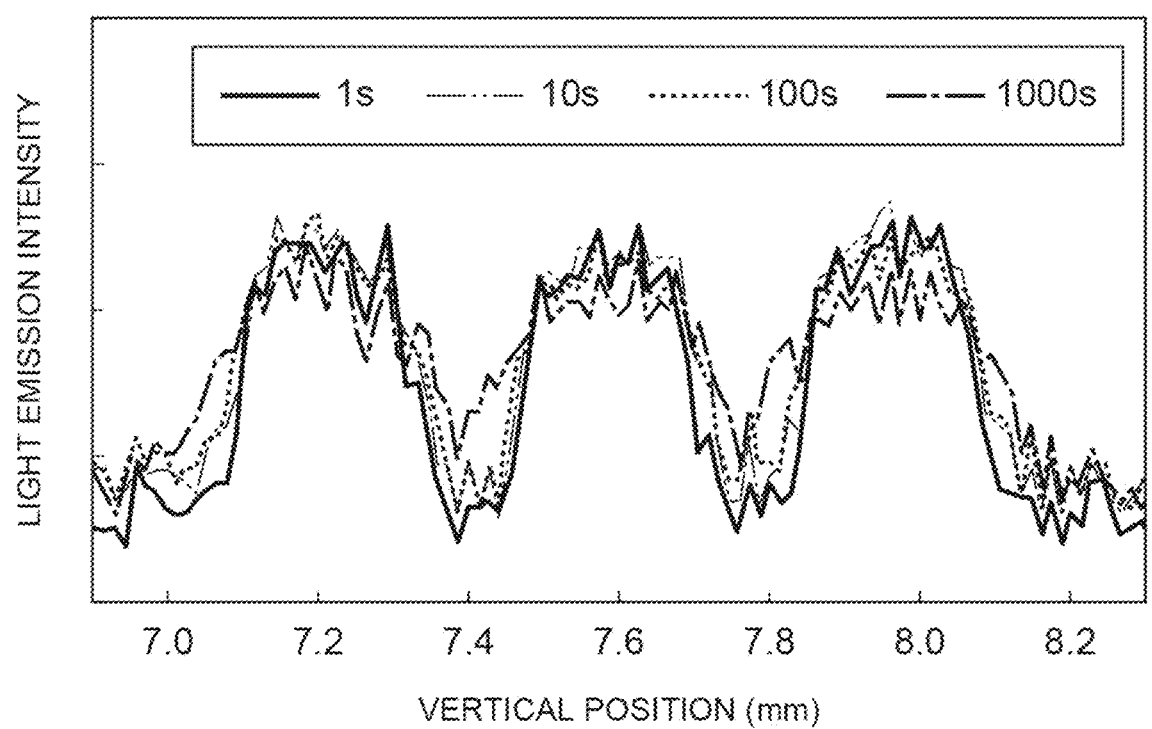
FIG. 39 is a graph showing experimental results.

Next, with respect to the organic light-emitting element 2 shown in FIG. 35, after performing a process "in which excitation light is incident to the organic light-emitting layer 23 through USAF1951 resolution test target while applying a reverse voltage of −2 V in a predetermined first period, application of the reverse voltage of −2 V is maintained in a predetermined delay period, and a forward voltage of +10 V is applied in a second period of 0 to 10 μs", a light emission state of the organic light-emitting layer 23 was observed. FIG. 37 is a photograph showing a light emission state of the organic light-emitting layer 23 at the time of irradiation with excitation light. In contrast, FIG. 38A to FIG. 38D are photographs showing a light emission state of the organic light-emitting layer 23 at the time of applying the forward voltage. A difference in FIG. 38A to FIG. 38D is a delay period, and delay periods of FIG. 38A to FIG. 38D are 1 s, 10 s, 100 s, and 1000 s, respectively. FIG. 39 is a graph showing a relationship between a position and the light emission intensity in cases shown in FIG. 38A to FIG. 38D. The horizontal axis of the graph shown in FIG. 39 corresponds to "a vertical position at a horizontal position of 10.5 mm" in the respective photographs shown in FIG. 38A to FIG. 38D. From the results shown in FIG. 37 to FIG. 39, it could be seen that expression by light emission is possible even in a pattern of 1 mm or less, and electrons generated due to separation of charges remains (that is, electrons are spatially retained) in a constant region in the organic light-emitting layer 23 even in any delay period.

Note that, when spatial retention of charges is regarded as suppression of a diffusion phenomenon of charges, it is considered that charge retention properties can be improved by maintaining the organic light-emitting layer 23 at a low temperature, by lowering charge mobility in the organic light-emitting layer 23, and by lowering a carrier concentration distribution in the organic light-emitting layer 23. From this, it is preferable that the light-emitting device 1 includes a temperature controller configured to adjust a temperature of the organic light-emitting layer 23.

Figure 40A:
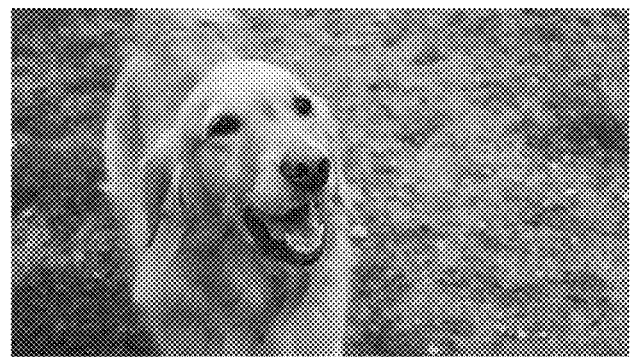
FIG. 40A and FIG. 40B are photographs showing a light emission state of an organic light-emitting layer of an organic light-emitting element of a modification example.
Figure 40B:

Next, with respect to the organic light-emitting element 2 shown in FIG. 35, after performing a process "in which excitation light is incident to the organic light-emitting layer 23 through a digital micromirror device (DMD) while applying a reverse voltage of −3.3 V in a predetermined first period, application of the reverse voltage of −3.3 V is maintained in a predetermined delay period, and a forward voltage of +6 V is applied in a second period of 0 to 10 μs", a light emission state of the organic light-emitting layer 23 was observed. FIG. 40A is a photograph showing a pattern image (pattern image by DMD) of excitation light projected to the organic light-emitting element 2. In contrast, FIG. 40B is a photograph showing a light emission state of the organic light-emitting layer 23 at the time of applying the forward voltage after passage of a delay time of 2 ms from irradiation of excitation light. From the results shown in FIG. 40A and FIG. 40B, it could be seen that the pattern image by DMD is maintained in intensity and spatially.

From the above-described verification results, it can be said that it may be appropriate that a buffer layer is not disposed between the charge block layer 25 and the second electrode 22 in order to retain charges and obtain light emission even when the delay period is long. That is, in order to retain charges and obtain light emission even in a case where the delay period is long, it may be appropriate that the second electrode 22 is directly formed on the charge block layer 25, and the second electrode 22 is in contact with the charge block layer 25. [Modification Examples]

The present disclosure is not limited to the above-described embodiment. For example, the charge block layer 25 may not have a HOMO level deeper than the HOMO level of the organic light emitters included in the organic light-emitting layer 23. Even in this case, light emission with a high peak intensity and a high response speed can be obtained.

Figure 27:
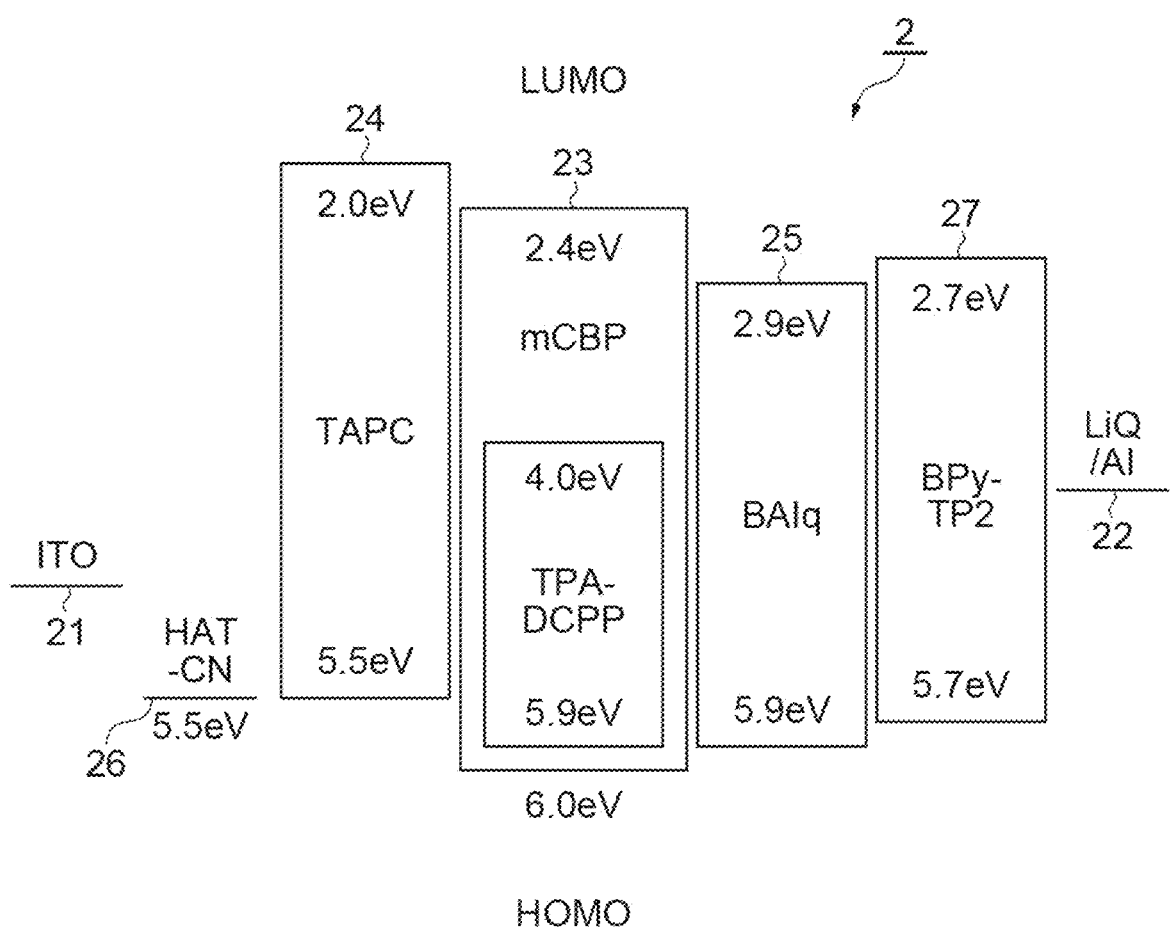
FIG. 27 is an energy diagram of an organic light-emitting element of a modification example.

FIG. 27 is an energy diagram of an organic light-emitting element 2 according to a modification example. The organic light-emitting element 2 shown in FIG. 27 is different from the example of the organic light-emitting element 2 shown in FIG. 2 in that the charge block layer 25 is formed from BAlq. The charge block layer 25 formed from BAlq has the same HOMO level (5.9 eV in FIG. 27) as the HOMO level (5.9 eV in FIG. 27) of the organic light emitters formed from TPA-DCPP.

Figure 28A:
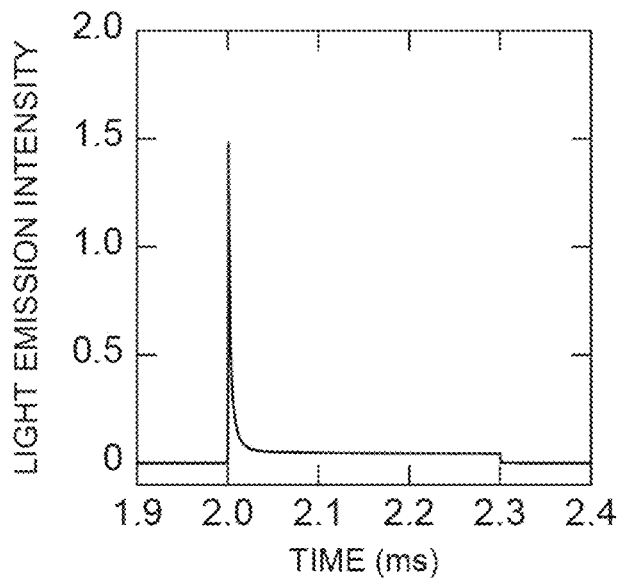
FIG. 28A and FIG. 28B are graphs showing experimental results.
Figure 28B:
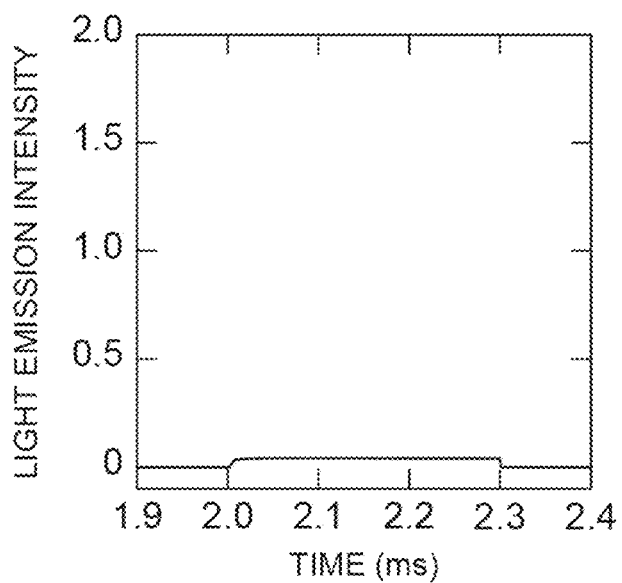

FIG. 28A is a graph showing a temporal variation of the light emission intensity in a case where the organic light-emitting element 2 shown in FIG. 27 is used and excitation light is incident to the organic light-emitting layer 23 in the first period. FIG. 28B is a graph showing a temporal variation of the light emission intensity in a case where the organic light-emitting element 2 shown in FIG. 27 is used, and excitation light is not incident to the organic light-emitting layer 23 in the first period. In experiments shown in FIG. 28A and FIG. 28B, excitation light is incident or not incident to the organic light-emitting layer 23 while applying a predetermined reverse voltage in a predetermined first period, application of the predetermined reverse voltage is maintained in each delay period, and a predetermined forward voltage is applied in a second period of 2 to 2.3 ms. In this manner, even in the organic light-emitting element 2 shown in FIG. 27 (that is, even when the charge block layer 25 does not have a HOMO level deeper than the HOMO level of the organic light emitters included in the organic light-emitting layer 23), when excitation light is incident to the organic light-emitting layer 23 in the first period, overshoot is observed in the light emission intensity immediately after boosting in the second period.

Regardless to whether or not the charge block layer 25 has a HOMO level deeper than the HOMO level of the organic light emitters included in the organic light-emitting layer 23, hole mobility in the charge block layer 25 may be lower than electron mobility in the charge block layer 25. Regardless to whether or not the charge block layer 25 has a HOMO level deeper than the HOMO level of the organic light emitters included in the organic light-emitting layer 23, the hole mobility in the charge block layer 25 may be $1\times10^{-4}$ cm²/Vs or less in a state in which an electric field of $1\times10^6$ V/cm occurs in the charge block layer 25. Even in any case, when the forward voltage is applied in the second period, movement of holes, which have moved from the first electrode 21 to the organic light-emitting layer 23 through the hole transporting layer 24, to the second electrode 22 is suppressed by the charge block layer 25. Accordingly, holes, which have moved from the first electrode 21 to the organic light-emitting layer 23 through the hole transporting layer 24, can be efficiently coupled to electrons which remain in the organic light-emitting layer 23. Note that, the hole mobility can be measured by a known method called a time-of-flight method.

Figure 29:
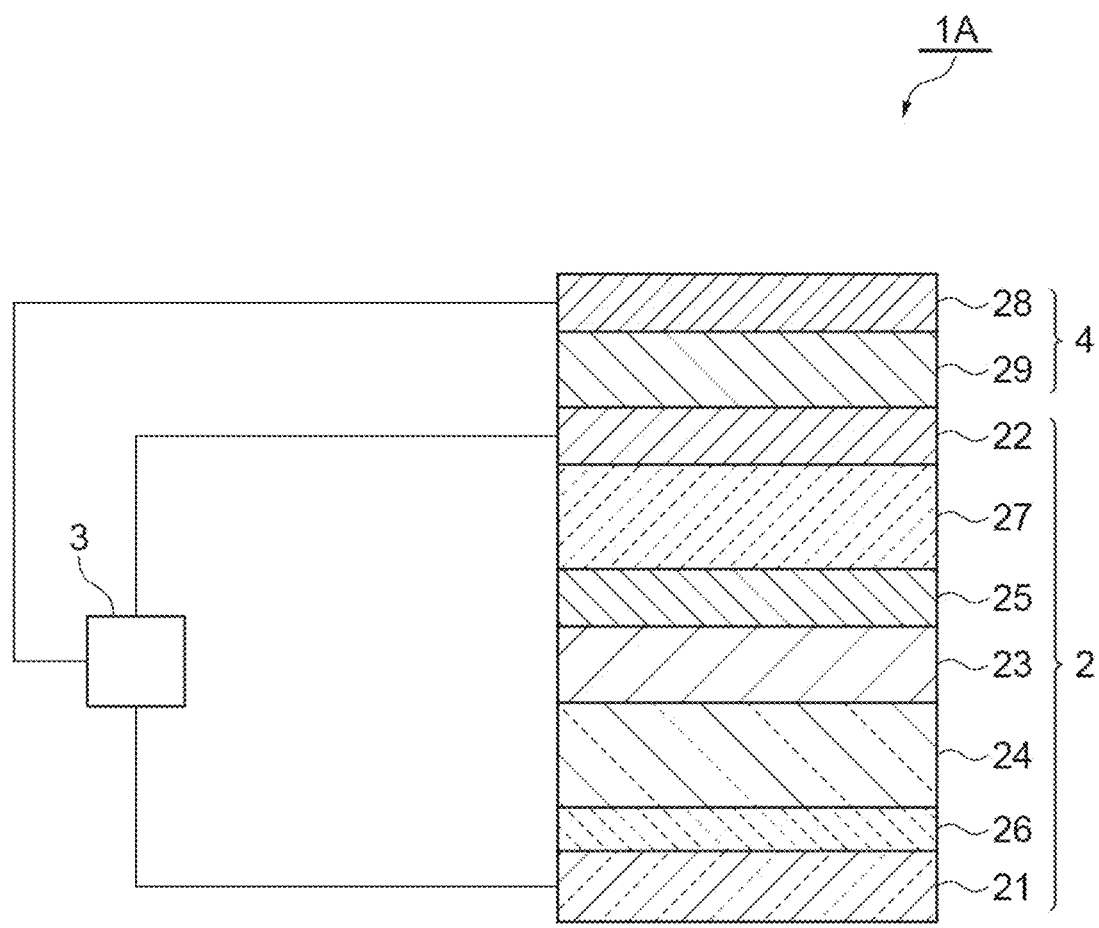
FIG. 29 is a configuration diagram of a light-emitting device of a modification example.

As shown in FIG. 29, a light-emitting device 1A may include a light source 4 that is configured integrally with the organic light-emitting element 2. In the light-emitting device 1A, the light source 4 includes a third electrode 28, and an additional organic light-emitting layer 29. The third electrode 28 is disposed to face the second electrode 22 on a side opposite to the first electrode 21. The additional organic light-emitting layer 29 is disposed between the second electrode 22 and the third electrode 28. According to the light-emitting device 1A, when the additional organic light-emitting layer 29 is caused to emit light, the organic light-emitting layer 23 can easily and reliably enter an excited state.

Figure 30:
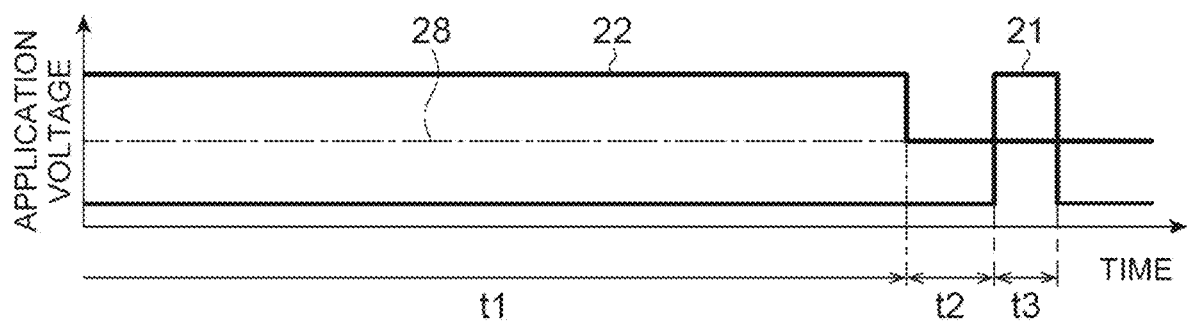
FIG. 30 is a timing chart of an application voltage in the light-emitting device shown in FIG. 29.

An operation example of the light-emitting device 1A will be described. As shown in FIG. 29 and FIG. 30, first, the controller 3 applies a voltage between the second electrode 22 and the third electrode 28 so that a forward electric field occurs in the additional organic light-emitting layer 29 in a first period t1 (in the example shown in FIG. 30, so that a potential of the second electrode 22 becomes positive with a potential of the third electrode 28 set as a reference), and applies a voltage between the first electrode 21 and the second electrode 22 in accordance with occurrence of a reverse electric field in the organic light-emitting layer 23 (so that the potential of the second electrode 22 becomes negative with the potential of the first electrode 21 set as a reference in the example shown in FIG. 30). Accordingly, excitation light is emitted from the additional organic light-emitting layer 29, the excitation light is incident to the organic light-emitting layer 23, and charges are separated in the organic light-emitting layer 23. In addition, electrons generated due to separation of charges are suppressed from moving to the second electrode 22 due to the charge block layer 25 and remain in the organic light-emitting layer 23, and holes generated due to separation of charges move to the first electrode 21 through the hole transporting layer 24.

Next, the controller 3 sets a potential difference between the second electrode 22 and the third electrode 28 to 0 so that an electric field does not occur in the additional organic light-emitting layer 29 in a delay period t2 subsequent to the first period t1, and applies a voltage between the first electrode 21 and the second electrode 22 so that a reverse electric field occurs in the organic light-emitting layer 23 (in an example shown in FIG. 30, the potential of the first electrode 21 becomes negative with the potential of the second electrode 22 set as a reference). According to this, emission of excitation light from the additional organic light-emitting layer 29 is stopped, and electrons remaining in the organic light-emitting layer 23 are maintained in this state.

Next, the controller 3 sets the potential difference between the second electrode 22 and the third electrode 28 to 0 so that an electric field does not occur in the additional organic light-emitting layer 29 in a second period t3 subsequent to the delay period t2, and applies a voltage between the first electrode 21 and the second electrode 22 so that a forward electric field occurs in the organic light-emitting layer 23 (in the example shown in FIG. 30, the potential of the first electrode 21 becomes positive with the potential of the second electrode 22 set as a reference). According to this, holes move from the first electrode 21 to the organic light-emitting layer 23 through the hole transporting layer 24, and are coupled to electrons remaining in the organic light-emitting layer 23, and thus light emission with a high peak intensity and a high response speed is obtained from the organic light-emitting layer 23.

Figure 31:
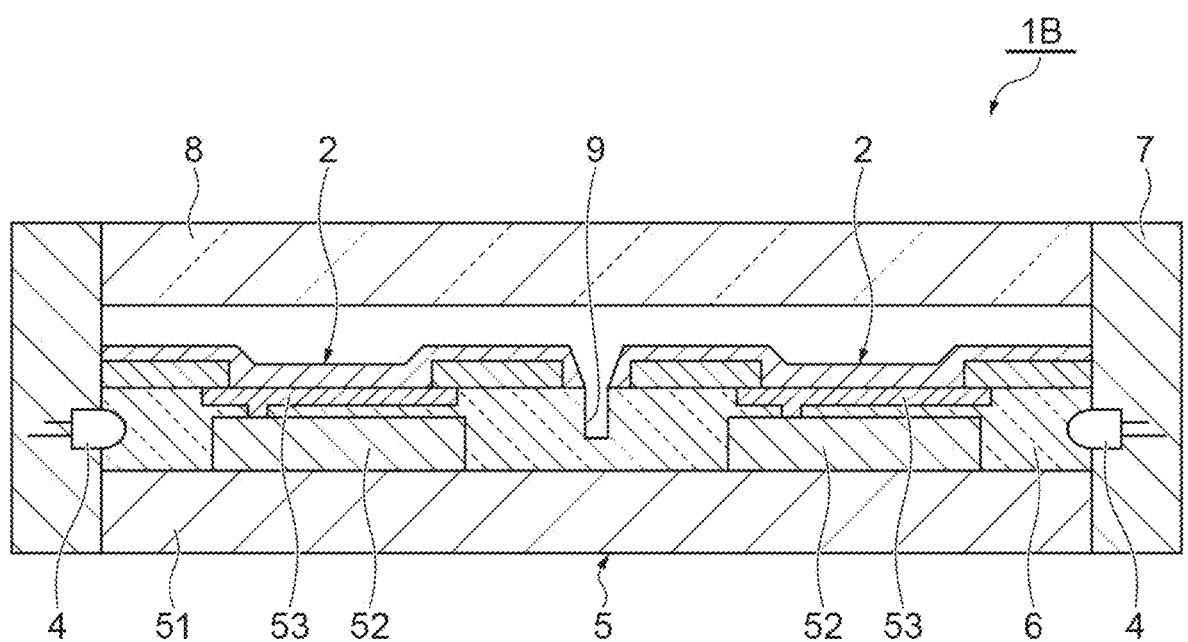
FIG. 31 is a configuration diagram of a light-emitting device of a modification example.

As shown in FIG. 31, a light-emitting device 1B may include a plurality of organic light-emitting elements 2, at least one light source 4, a circuit board 5, and a light guide layer 6. The circuit board 5 includes a substrate 51, and a plurality of switching elements 52. The plurality of switching elements 52 are two-dimensionally arranged along a main surface of the substrate 51. Each of the organic light-emitting elements 2 is disposed on each of the switching elements 52, and is electrically connected to each of the switching elements 52 by an interconnection 53. The plurality of organic light-emitting elements 2 are sealed by the circuit board 5, a tubular side wall 7, and a light-transmitting substrate 8. The side wall 7 is joined to the circuit board 5. The light-transmitting substrate 8 is joined to the side wall 7 to face the circuit board 5 with the plurality of organic light-emitting elements 2 interposed therebetween. The light guide layer 6 is disposed on the circuit board 5. The light guide layer 6 is continuously formed between the circuit board 5 and the plurality of organic light-emitting elements 2. That is, the plurality of organic light-emitting elements 2 are disposed on the circuit board 5 with the light guide layer 6 interposed therebetween. The least one light source 4 is attached to the side wall 7, and the at least one light source 4 emits excitation light to the light guide layer 6.

In the light-emitting device 1B, the plurality of organic light-emitting elements 2 are separated from each other when a groove 9 is formed after respective layers are integrally formed through film formation. In the plurality of organic light-emitting elements 2, in a state in which the plurality of first electrode 21 are electrically separated from each other, a plurality of first electrodes 21 are electrically connected to the circuit board 5, and thus a plurality of organic light-emitting layers 23 are electrically separated from each other. According to the light-emitting device 1B, light emission with a high peak intensity and a high response speed can be obtained from each of the plurality of organic light-emitting elements 2 at arbitrary timing. The light-emitting device 1B is applicable to a two-dimensional array pulse light source capable of emitting an arbitrary pattern.

The organic light emitter included in the organic light-emitting layer 23 is not limited to a configuration formed from a molecule having a charge separating function and a light emitting function, and may be constituted by a molecule having a molecule having a charge separating function (hereinafter, referred to as "charge separator"), and a molecule having a light emitting function (hereinafter, referred to as "light emitter"). In this case, it is necessary for the charge block layer 25 to have a LUMO level shallower than a LUMO level of each of the charge separator and the light emitter. Note that, in a case where the organic light emitters are constituted by the molecule having the charge separating function and the light emitting function, the organic light-emitting layer 23 may contain one kind of molecule or a plurality of kinds of molecules as the molecule having the charge separating function and the light emitting function. In addition, in a case where the organic light emitters are constituted by the charge separator and the light emitter, the organic light-emitting layer 23 may contain one kind of molecule or a plurality of kinds of molecules as a molecule of at least one of the charge separator and the light emitter.

When the organic light emitters are constituted by the molecule having the charge separating function and the light emitting function, a conversion loss from separation of charges to light emission substantially hardly occurs. When the organic light emitters are constituted by the charge separator and the light emitter, a molecule having a high charge separation efficiency and a molecule having a high light emission efficiency can be used separately, and thus a material selection width becomes wide, and high characteristics are likely to be obtained.

Figure 32:
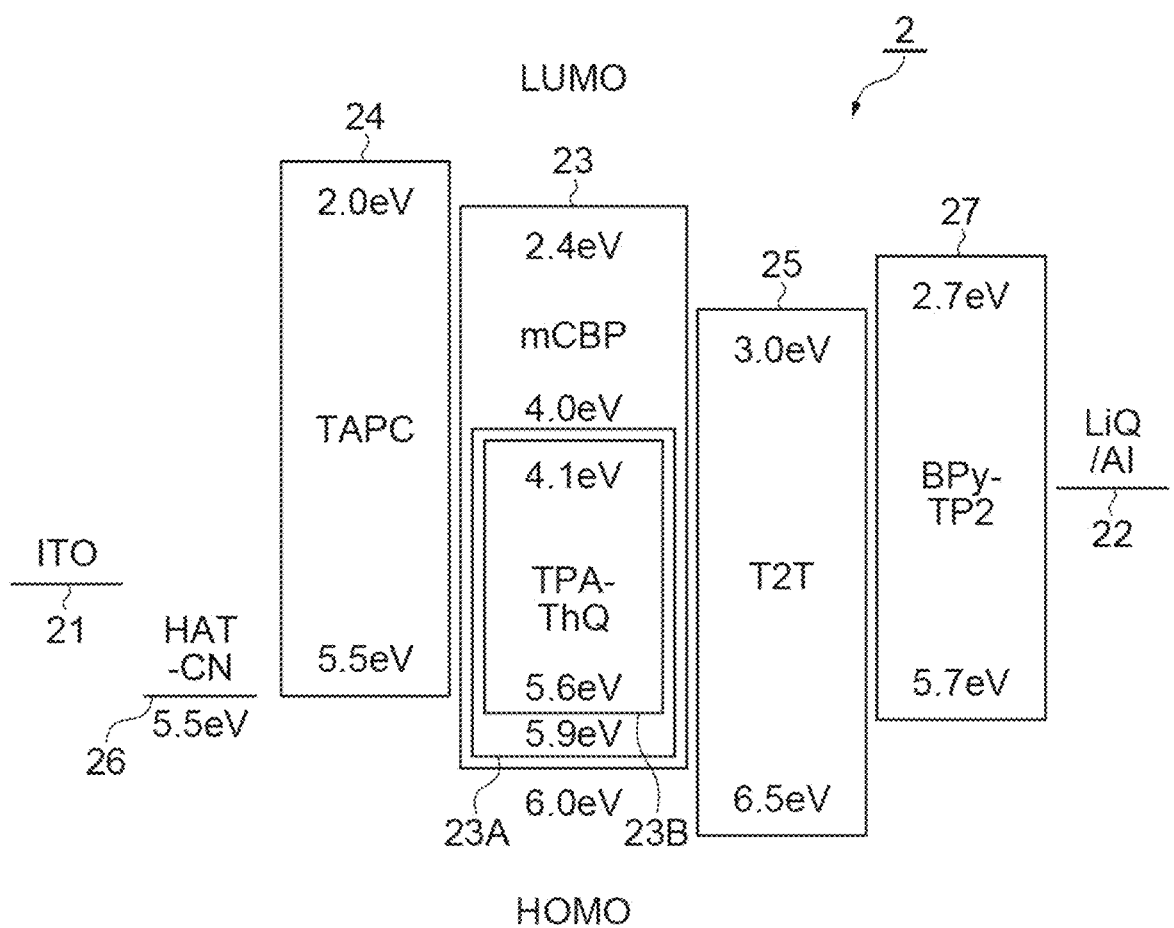
FIG. 32 is an energy diagram of an organic light-emitting element of a modification example.

FIG. 32 is an energy diagram of an organic light-emitting element 2 of a modification example. The organic light-emitting element 2 shown in FIG. 32 is different from the organic light-emitting element 2 shown in FIG. 2 in that the organic light emitters included in the organic light-emitting layer 23 are constituted by a charge separator 23A and a light emitter 23B. In the organic light-emitting element 2 shown in FIG. 32, TPA-DCPP that functions as the charge separator 23A and TPA-ThQ that functions as the light emitter 23B are mixed.

Figure 33:
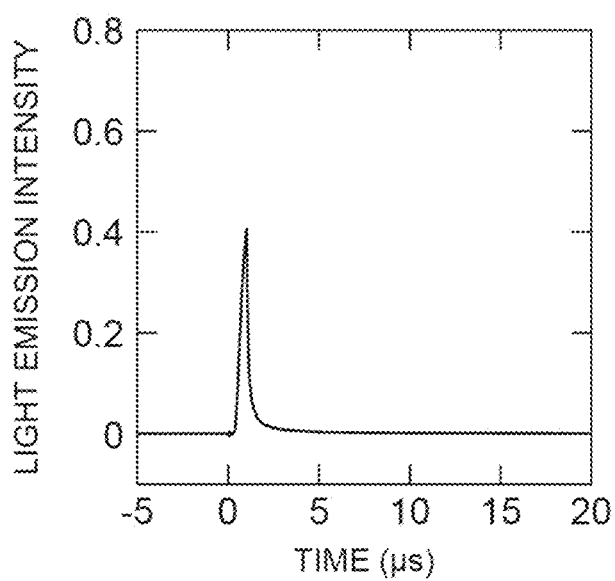
FIG. 33 is a graph showing experimental results.

FIG. 33 is a graph showing a temporal variation of the light emission intensity in a case where the organic light-emitting element 2 shown in FIG. 32 is used, excitation light is incident to the organic light-emitting layer 23 while applying a predetermined reverse voltage in a predetermined first period, application of the predetermined reverse voltage is maintained in each delay period, and a predetermined forward voltage is applied in a second period of 1 µs. As described above, even in the organic light-emitting element 2 shown in FIG. 33, when excitation light is incident to the organic light-emitting layer 23, overshoot is observed in the light emission intensity immediately after boosting in the second period. Note that, from a light emission wavelength that is observed, it could be seen that TPA-ThQ functions as the light emitter 23B instead of the TPA-DCPP.

Figure 34A:
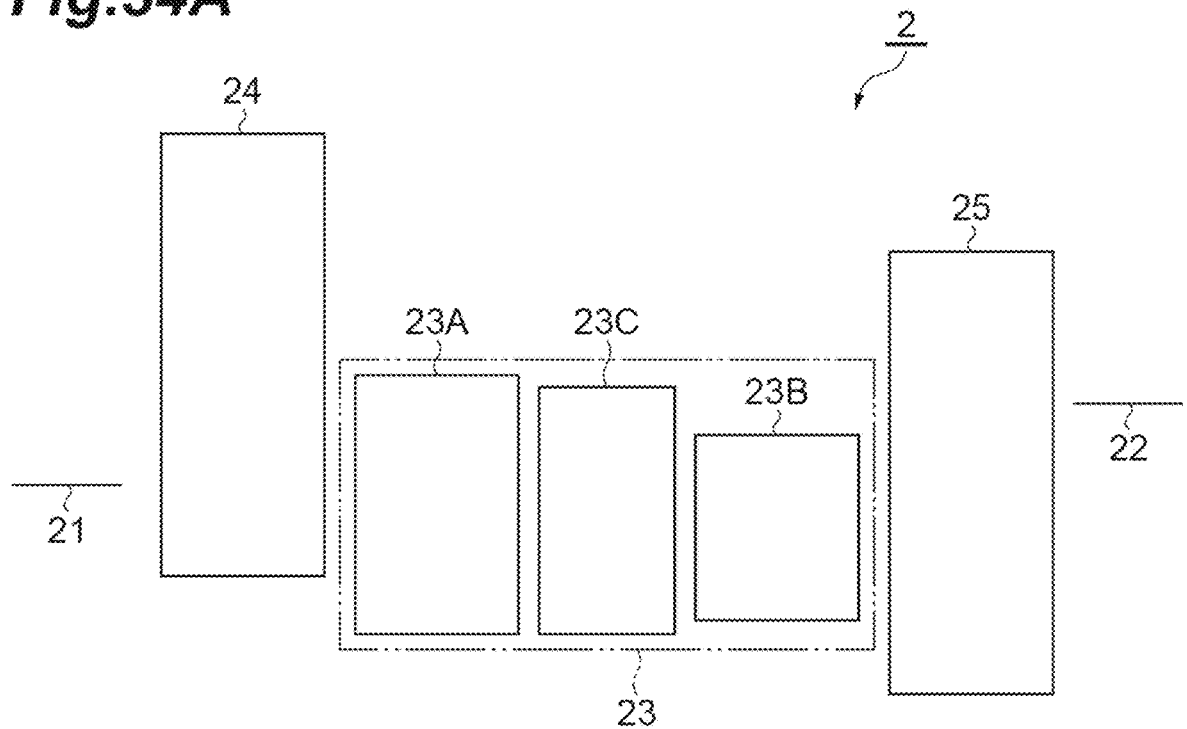
FIG. 34A and FIG. 34B are energy diagrams of an organic light-emitting element of a modification example.
Figure 34B:
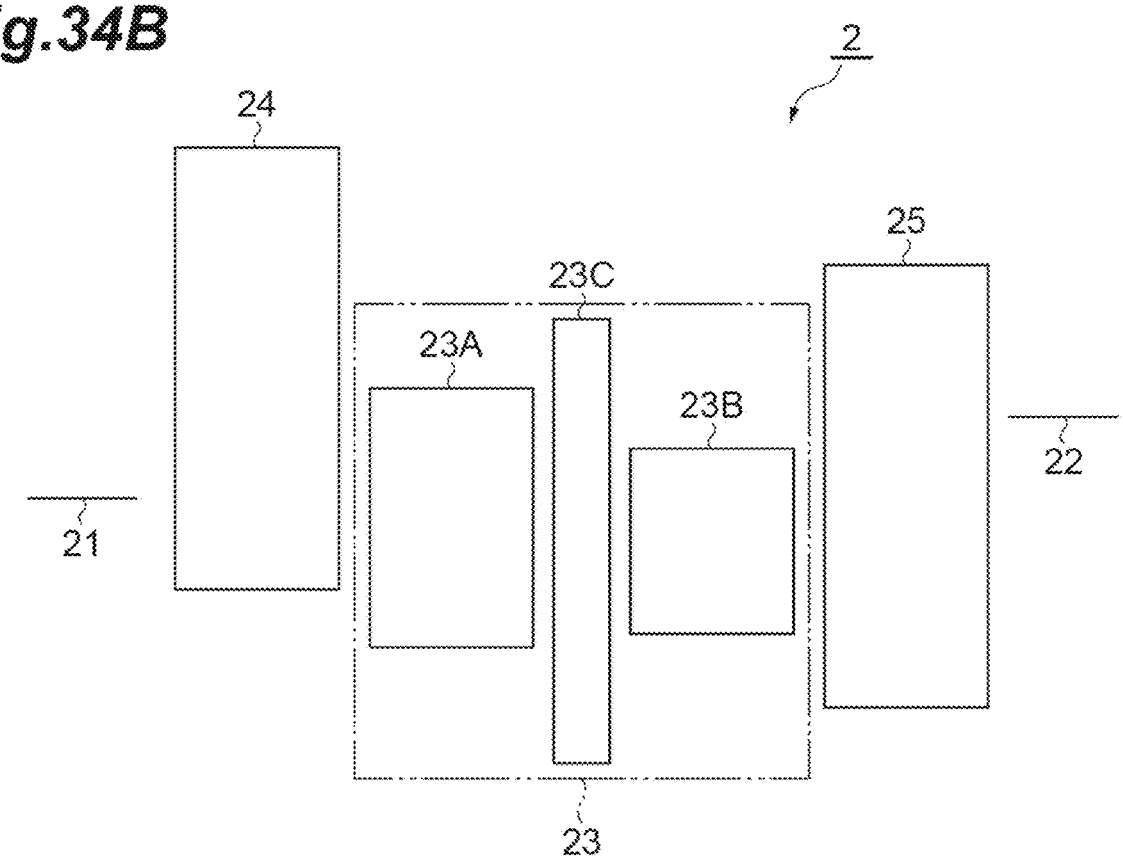

FIG. 34A and FIG. 34B are energy diagrams of an organic light-emitting element 2 of a modification example. In an organic light-emitting element 2 shown in FIG. 34A and FIG. 34B, the organic light emitters included in the organic light-emitting layer 23 are constituted by the charge separator 23A and the light emitter 23B, and each of the charge separator 23A and the light emitter 23B constitutes a separate layer. A layer of the charge separator 23A is disposed on the hole transporting layer 24 side, and a layer of the light emitter 23B is disposed on the charge block layer 25 side. A buffer layer 23C is disposed between the layer of the charge separator 23A and the layer of the light emitter 23B. In this case, in order to accumulate electrons generated due to separation of charge in the light emitter 23B, it is necessary for the charge separator 23A to have a LUMO level shallower than a LUMO level of the light emitter 23B.

A buffer layer 23C is a layer that suppresses energy movement from the charge separator 23A to the light emitter 23B. In a case where the thickness of the buffer layer 23C is 5 nm or greater, as shown in FIG. 34A, it is preferable that the buffer layer 23C has a LUMO level that is deeper than the LUMO level of the charge separator 23A and is shallower than the LUMO level of the light emitter 23B, and it is preferable that the buffer layer 23C has a HOMO level shallower than a HOMO level of the charge separator 23A.

In a case where the thickness of the buffer layer 23C is less than 5 nm, since penetration of charges by an electric field becomes possible, as shown in FIG. 34B, the LUMO level and the HOMO level of the buffer layer 23C are ignored.

As in the organic light-emitting element 2 shown in FIG. 32, when the charge separator 23A and the light emitter 23B are mixed, since the charge separator 23A and the light emitter 23B are spatially adjacent to each other, energy movement efficiency from the charge separator 23A to the light emitter 23B becomes high, and high characteristics are likely to be obtained. As in the organic light-emitting element 2 shown in FIG. 34A and FIG. 34B, when the charge separator 23A and the light emitter 23B constitute separate layers, respectively, a loss of charges separated from the charge separator 23A is less likely to occur, and thus high characteristics are likely to be obtained. Note that, in a case where the charge separator 23A and the light emitter 23B constitute separate layers, respectively, the buffer layer 23C may not be disposed between the layer of the charge separator 23A and the layer of the light emitter 23B.

When the light-emitting device 1 includes the controller 3, the light source 4 may not be provided. In addition, when the light-emitting devices 1, 1A, and 1B include the light source 4, the controller 3 may not be provided. In addition, in the light-emitting devices 1 and 1A, or the organic light-emitting element 2, a wavelength filter configured to cut out disturbance light having a wavelength shorter than a light emission wavelength of the organic light-emitting layer 23 may be provided on an outer side of the first electrode 21. In this case, it is possible to prevent separation of charges from occurring in the organic light-emitting layer 23 due to incidence of the disturbance light. In addition, the light-emitting devices 1, 1A, and 1B may include a shutter that allows light emitted from the organic light-emitting element 2 to be transmitted therethrough at desired timing. In this case, when the shutter is closed in the first period for which excitation light is incident to the organic light-emitting layer 23, it is possible to prevent light from being emitted to the outside in the first period. In addition, various materials and shapes are applicable to the configurations in the above-described embodiment without limitation to the above-described materials and shapes. As an example, the charge block layer 25 may be formed from an electrical insulating material such as a polymer. In addition, for example, in the light-emitting device 1, the second electrode 22 may be formed from a material having a light transmitting property. In this case, light generated in the organic light-emitting layer 23 can be emitted to the outside through the second electrode 22. In addition, in this case, when a wavelength filter that allows light having a wavelength shorter than the light emission wavelength of the organic light-emitting layer 23 to be transmitted therethrough is provided on an outer side of the first electrode 21, excitation light is incident from the first electrode 21 side to the organic light-emitting layer 23, and light generated in the organic light-emitting layer 23 can be emitted to the outside from the second electrode 22 side.

In the above-described organic light-emitting layer 23, separation of charges occurs due to incidence of excitation light, but separation of charges may occur due to incidence of X-rays. In a case where separation of charges is caused to occur in the organic light-emitting layer 23 by incidence of the X-rays, an X-ray source that emits X-rays is used as the light source 4. That is, the above-described organic light-emitting element 2 is "organic light-emitting element that is excited due to an electromagnetic wave" that includes the organic light-emitting layer 23 in which separation of charges occurs due to incidence of "excitation light and an electromagnetic wave including X-rays". However, in a case where excitation light is used as the electromagnetic wave, since excitation light is an electromagnetic wave in an energy band with high absorption efficiency, generation of charges becomes possible with incidence of weak light. Note that, an example of a wavelength of the excitation light is a wavelength from a short wavelength region of ultraviolet rays to a short wavelength region of infrared rays (for example, 1 nm to 10 μm).

An organic light-emitting element according to an aspect of the present disclosure is [1] "an organic light-emitting element that is excited by an electromagnetic wave. The organic light-emitting element includes: a first electrode; a second electrode disposed to face the first electrode; an organic light-emitting layer disposed between the first electrode and the second electrode, where separation of charges occurs due to incidence of the electromagnetic wave; a hole transporting layer disposed between the first electrode and the organic light-emitting layer; and a charge block layer disposed between the second electrode and the organic light-emitting layer, wherein the charge block layer has a LUMO level shallower than a LUMO level of organic light emitters included in the organic light-emitting layer".

In the organic light-emitting element described in [1], for example, in a state in which a voltage is applied between the first electrode and the second electrode so that a reverse electric field causing separation of charges to occur occurs in the organic light-emitting layer, when separation of charges occurs in the organic light-emitting layer due to incidence of the electromagnetic wave, electrons generated due to separation of charges are suppressed from moving to the second electrode due to the charge block layer and remain in the organic light-emitting layer, and holes generated due to separation of charges move to the first electrode through the hole transporting layer. In this state, for example, when a voltage is applied between the first electrode and the second electrode so that a forward electric field causing recoupling of charges to occur occurs in the organic light-emitting layer, holes move from the first electrode to the organic light-emitting layer through the hole transporting layer, and are coupled to electrons remaining in the organic light-emitting layer. Typically, hole mobility in the organic light-emitting layer is higher than electron mobility in the organic light-emitting layer. Accordingly, when electrons of which mobility is relatively low are caused to remain in the organic light-emitting layer, holes of which mobility is relatively high are caused to move to the organic light-emitting layer, and the holes and the electrons are coupled, light emission with a high peak intensity occurs at a high response speed. Accordingly, according to the organic light-emitting element, light emission with a high peak intensity and a high response speed can be obtained.

The organic light-emitting element according to the aspect of the present disclosure may be [2] "the organic light-emitting element according to [1], wherein the charge block layer has a HOMO level deeper than a HOMO level of the organic light emitters". According to the organic light-emitting element described in [2], for example, when a voltage has been applied between the first electrode and the second electrode so that the forward electric field causing coupling of charges to occur occurs in the organic light-emitting layer, movement of holes, which have moved from the first electrode to the organic light-emitting layer through the hole transporting layer, to the second electrode is suppressed due to the charge block layer. Accordingly, holes which have moved from the first electrode to the organic light-emitting layer through the hole transporting layer can be effectively coupled to electrons remaining in the organic light-emitting layer.

The organic light-emitting element according to the aspect of the present disclosure may be [3] "the organic light-emitting element according to [1] or [2], wherein hole mobility in the charge block layer is lower than electron mobility in the charge block layer". According to the organic light-emitting element described in [3], for example, when a voltage has been applied between the first electrode and the second electrode so that the forward electric field causing coupling of charges to occur occurs in the organic light-emitting layer, movement of holes, which have moved from the first electrode to the organic light-emitting layer through the hole transporting layer, to the second electrode is suppressed due to the charge block layer. Accordingly, holes which have moved from the first electrode to the organic light-emitting layer through the hole transporting layer can be effectively coupled to electrons remaining in the organic light-emitting layer.

The organic light-emitting element according to the aspect of the present disclosure may be [4] "the organic light-emitting element according to any one of [1] to [3], wherein hole mobility in the charge block layer is $1\times10^{-4}$ cm$^2$/Vs or less in a state in which an electric field of $1\times10^6$ V/cm occurs in the charge block layer". According to the organic light-emitting element described in [4], for example, when a voltage has been applied between the first electrode and the second electrode so that the forward electric field causing coupling of charges to occur occurs in the organic light-emitting layer, movement of holes, which have moved from the first electrode to the organic light-emitting layer through the hole transporting layer, to the second electrode is suppressed due to the charge block layer. Accordingly, holes which have moved from the first electrode to the organic light-emitting layer through the hole transporting layer can be effectively coupled to electrons remaining in the organic light-emitting layer.

The organic light-emitting element according to the aspect of the present disclosure may be [5] "the organic light-emitting element according to any one of [1] to [4], wherein the hole transporting layer has a thickness so that a distance between the first electrode and the charge block layer becomes 400 nm or less". According to the organic light-emitting element described in [5], for example, in a state in which a voltage has been applied between the first electrode and the second electrode so that the reverse electric field causing coupling of charges to occur occurs in the organic light-emitting layer, when separation of charges occurs in the organic light-emitting layer due to incidence of the electromagnetic wave, electrons generated due to separation of charges can be sufficiently accumulated in the organic light-emitting layer.

The organic light-emitting element according to the aspect of the present disclosure may be [6] "the organic light-emitting element according to any one of [1] to [5], wherein the electromagnetic wave is excitation light". According to the organic light-emitting element described in [6], since the excitation light is an electromagnetic wave in an energy band with high absorption efficiency, generation of charges becomes possible by incidence of weak light.

A light-emitting device according to another aspect of the present disclosure is [7] "a light-emitting device including the organic light-emitting element according to any one of [1] to [6]; and a controller configured to control the organic light-emitting element, wherein the controller causes a potential difference between the first electrode and the second electrode to vary so that recoupling of the charges occurs in a second period after passage of a delay period from a first period for which the electromagnetic wave is incident to the organic light-emitting layer".

According to the light-emitting device described in [7], as described above, light emission with a high peak intensity and a high response speed can be obtained in the organic light-emitting element.

The light-emitting device according to the aspect of the present disclosure may be [8] "the light-emitting device according to [7], wherein the controller applies a voltage between the first electrode and the second electrode in the first period and the delay period so that an electric field in a direction reverse to a forward electric field causing recoupling of the charges to occur occurs in the organic light-emitting layer, and the controller applies a voltage between the first electrode and the second electrode in the second period so that the forward electric filed occurs in the organic light-emitting layer". According to the light-emitting device described in [8], light emission with a high peak intensity and a high response speed can be more reliably obtained in the organic light-emitting element.

The light-emitting device according to the aspect of the present disclosure may be [9] "the light-emitting device according to [7] or [8], wherein the second period is a period of 100 ns to 100 μs". According to the light-emitting device described in [9], light emission with a high peak intensity and a high response speed can be more reliably obtained in the organic light-emitting element.

The light-emitting device according to the aspect of the present disclosure may be [10] "the light-emitting device according to any one of [7] to [9], further including a light source configured to emit the electromagnetic wave, wherein the controller controls the light source so that the electromagnetic wave is incident to the organic light-emitting layer in the first period". According to the light-emitting device described in [10], the organic light-emitting layer can easily and reliably enter an excited state (that is, a state in which electrons generated due to separation of charges remain).

The light-emitting device according to the aspect of the present disclosure may be [11] "the light-emitting device including: the organic light-emitting element according to any one of [1] to [6]; and a light source configured to emit the electromagnetic wave".

According to the light-emitting device described in [11], as described above, light emission with a high peak intensity and a high response speed can be obtained in the organic light-emitting element.

The light-emitting device according to the aspect of the present disclosure may be [12] "the light-emitting device according to [11], wherein the light source includes a third electrode disposed to face the second electrode on a side opposite to the first electrode, and an additional organic light-emitting layer disposed between the second electrode and the third electrode". According to the light-emitting device described in [12], the organic light-emitting layer can easily and reliably enter an excited state by causing the additional organic light-emitting layer to emit light.

The light-emitting device according to the aspect of the present disclosure may be [13] "the light-emitting device according to [11], further including: a circuit board; and a light guide layer disposed on the circuit board, wherein the organic light-emitting element is each of a plurality of the organic light-emitting elements disposed on the circuit board with the light guide layer interposed therebetween, the first electrode is each of a plurality of the first electrodes included in the plurality of organic light-emitting elements, the organic light-emitting layer is each of a plurality of organic light-emitting layers included in the plurality of organic light-emitting elements, the plurality of first electrode are electrically connected to the circuit board in a state in which the plurality of first electrode are electrically separated from each other, the plurality of organic light-emitting layers are electrically separated from each other, and the light source emits the electromagnetic wave to the light guide layer". According to the light-emitting device described in [13], light emission with a high peak intensity and a high response speed can be obtained at arbitrary timing from each of the plurality of organic light-emitting element.

A light-emitting method according to still another aspect of the present disclosure is [14] "the light-emitting method using the organic light-emitting element according to any one of [1] to [6], the method including: a step where the electromagnetic wave is incident to the organic light-emitting layer in a first period; and a step where a potential difference between the first electrode and the second electrode is caused to vary so that recoupling of the charges occurs in a second period after passage of a delay period from the first period".

According to the light-emitting method described in [14], as described above, light emission with a high peak intensity and a high response speed can be obtained in the organic light-emitting element.

According to the present disclosure, it is possible to provide an organic light-emitting element, a light-emitting device, and a light-emitting method which are capable of obtaining light emission with a high peak intensity and a high response speed.

What is claimed is:

1. An organic light-emitting element that is excited by an electromagnetic wave, comprising:
  a first electrode;
  a second electrode disposed to face the first electrode;
  an organic light-emitting layer disposed between the first electrode and the second electrode, where separation of charges occurs due to incidence of the electromagnetic wave;
  a hole transporting layer disposed between the first electrode and the organic light-emitting layer; and
  a charge block layer disposed between the second electrode and the organic light-emitting layer,
  wherein the charge block layer has a LUMO level shallower than a LUMO level of organic light emitters included in the organic light-emitting layer, and
  wherein hole mobility in the charge block layer is $1 \times 10^{-4}$ cm$^2$/Vs or less in a state in which an electric field of $1 \times 10^6$ V/cm occurs in the charge block layer.

2. The organic light-emitting element according to claim 1,
  wherein the charge block layer has a HOMO level deeper than a HOMO level of the organic light emitters.

3. The organic light-emitting element according to claim 1,
  wherein hole mobility in the charge block layer is lower than electron mobility in the charge block layer.

4. The organic light-emitting element according to claim 1,
  wherein the hole transporting layer has a thickness so that a distance between the first electrode and the charge block layer becomes 400 nm or less.

5. The organic light-emitting element according to claim 1,
wherein the electromagnetic wave is excitation light.

6. A light-emitting device comprising:
the organic light-emitting element according to claim 1; and
a controller configured to control the organic light-emitting element,
wherein the controller causes a potential difference between the first electrode and the second electrode to vary so that recoupling of the charges occurs in a second period after passage of a delay period from a first period for which the electromagnetic wave is incident to the organic light-emitting layer.

7. The light-emitting device according to claim 6,
wherein the controller applies a voltage between the first electrode and the second electrode in the first period and the delay period so that an electric field in a direction reverse to a forward electric field causing recoupling of the charges to occur occurs in the organic light-emitting layer, and
the controller applies a voltage between the first electrode and the second electrode in the second period so that the forward electric filed occurs in the organic light-emitting layer.

8. The light-emitting device according to claim 6,
wherein the second period is a period of 100 ns to 100 μs.

9. The light-emitting device according to claim 6, further comprising a light source configured to emit the electromagnetic wave,
wherein the controller controls the light source so that the electromagnetic wave is incident to the organic light-emitting layer in the first period.

10. A light-emitting device comprising:
the organic light-emitting element according to claim 1; and
a light source configured to emit the electromagnetic wave.

11. The light-emitting device according to claim 10,
wherein the light source includes,
a third electrode disposed to face the second electrode on a side opposite to the first electrode, and
an additional organic light-emitting layer disposed between the second electrode and the third electrode.

12. The light-emitting device according to claim 10, further comprising:
a circuit board; and
a light guide layer disposed on the circuit board,
wherein the organic light-emitting element is each of a plurality of the organic light-emitting elements disposed on the circuit board with the light guide layer interposed therebetween,
the first electrode is each of a plurality of the first electrodes included in the plurality of organic light-emitting elements,
the organic light-emitting layer is each of a plurality of organic light-emitting layers included in the plurality of organic light-emitting elements,
the plurality of first electrode are electrically connected to the circuit board in a state in which the plurality of first electrode are electrically separated from each other,
the plurality of organic light-emitting layers are electrically separated from each other, and
the light source emits the electromagnetic wave to the light guide layer.

13. A light-emitting method using the organic light-emitting element according to claim 1, the method comprising:
a step where the electromagnetic wave is incident to the organic light-emitting layer in a first period; and
a step where a potential difference between the first electrode and the second electrode is caused to vary so that recoupling of the charges occurs in a second period after passage of a delay period from the first period.

14. A light-emitting device comprising:
an organic light-emitting element that is excited by an electromagnetic wave, comprising:
a first electrode;
a second electrode disposed to face the first electrode;
an organic light-emitting layer disposed between the first electrode and the second electrode, where separation of charges occurs due to incidence of the electromagnetic wave;
a hole transporting layer disposed between the first electrode and the organic light-emitting layer; and
a charge block layer disposed between the second electrode and the organic light-emitting layer,
wherein the charge block layer has a LUMO level shallower than a LUMO level of organic light emitters included in the organic light-emitting layer; and
a light source configured to emit the electromagnetic wave, wherein the light source includes,
a third electrode disposed to face the second electrode on a side opposite to the first electrode, and
an additional organic light-emitting layer disposed between the second electrode and the third electrode.

15. A light-emitting device comprising:
an organic light-emitting element that is excited by an electromagnetic wave, comprising:
a first electrode;
a second electrode disposed to face the first electrode;
an organic light-emitting layer disposed between the first electrode and the second electrode, where separation of charges occurs due to incidence of the electromagnetic wave;
a hole transporting layer disposed between the first electrode and the organic light-emitting layer; and
a charge block layer disposed between the second electrode and the organic light-emitting layer,
wherein the charge block layer has a LUMO level shallower than a LUMO level of organic light emitters included in the organic light-emitting layer;
a light source configured to emit the electromagnetic wave;
a circuit board; and
a light guide layer disposed on the circuit board,
wherein the organic light-emitting element is each of a plurality of the organic light-emitting elements disposed on the circuit board with the light guide layer interposed therebetween,
the first electrode is each of a plurality of the first electrodes included in the plurality of organic light-emitting elements,
the organic light-emitting layer is each of a plurality of organic light-emitting layers included in the plurality of organic light-emitting elements,
the plurality of first electrode are electrically connected to the circuit board in a state in which the plurality of first electrode are electrically separated from each other,
the plurality of organic light-emitting layers are electrically separated from each other, and the light source emits the electromagnetic wave to the light guide layer.

\* \* \* \* \*